United States Patent
Clark

(10) Patent No.: US 9,467,144 B2
(45) Date of Patent: Oct. 11, 2016

(54) RADIATION HARDENED DIGITAL CIRCUIT

(71) Applicant: Lawrence T. Clark, Phoenix, AZ (US)

(72) Inventor: Lawrence T. Clark, Phoenix, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 14/808,348

(22) Filed: Jul. 24, 2015

(65) Prior Publication Data

US 2016/0028397 A1 Jan. 28, 2016

Related U.S. Application Data

(60) Provisional application No. 62/028,669, filed on Jul. 24, 2014.

(51) Int. Cl.
*H03K 3/00* (2006.01)
*H03K 19/003* (2006.01)
*H03K 19/007* (2006.01)

(52) U.S. Cl.
CPC ...... *H03K 19/0033* (2013.01); *H03K 19/0075* (2013.01)

(58) Field of Classification Search
None
See application file for complete search history.

(56) References Cited

U.S. PATENT DOCUMENTS

| 7,719,304 | B1 * | 5/2010 | Clark | H03K 3/0372 326/14 |
| 2009/0045834 | A1 * | 2/2009 | Farwell | H03K 19/0033 326/21 |
| 2009/0302882 | A1 * | 12/2009 | Duflot | H03K 19/1731 326/8 |
| 2013/0086444 | A1 * | 4/2013 | Liu | G06F 11/08 714/752 |
| 2014/0077854 | A1 * | 3/2014 | Clark | H03K 3/0375 327/202 |
| 2016/0028397 | A1 * | 1/2016 | Clark | H03K 19/0075 327/205 |

OTHER PUBLICATIONS

Avirneni, Naga, et al., "Low Overhead Soft Error Mitigation Techniques for High-Performance and Aggressive Designs," IEEE Transactions on Computers, vol. 61, Issue 4, Apr. 2012, IEEE Computer Society, pp. 488-501.
Black, J.D., et al., "Characterizing SRAM Single Event Upset in Terms of Single and Multiple Node Charge Collection," IEEE Transactions on Nuclear Science, vol. 55, Issue 6, Dec. 2008, pp. 2943-2947.
Cabanas-Holmen, Manuel, et al., "Predicting the Single-Event Error Rate of a Radiation Hardened by Design Microprocessor," IEEE Transactions on Nuclear Science, vol. 58, Issue 6, Dec. 2011, IEEE, pp. 2726-2733.

(Continued)

*Primary Examiner* — Lincoln Donovan
*Assistant Examiner* — Khareem E Almo
(74) *Attorney, Agent, or Firm* — Withrow & Terranova, P.L.L.C.

(57) ABSTRACT

This disclosure relates generally to radiation hardened digital circuits. In one embodiment, a radiation hardened digital circuit includes a delay network and a first Muller C element. The delay network is configured to generate a first delayed clock signal from a global clock signal such that that the first delayed clock signal is delayed with respect to the global clock signal. The first Muller C element is configured to generate a first clock input signal and set the first clock input signal to one of a set of clock states in response to the first delayed clock signal and the global clock signal each being provided in a same one of the set of clock states and is configured to hold the first clock input signal otherwise. Thus, a radiation strike is prevented from causing a soft error in the first clock input signal.

20 Claims, 14 Drawing Sheets

(56) References Cited

OTHER PUBLICATIONS

Calin, T., et al., "Upset Hardened Memory Design for Submicron CMOS Technology," IEEE Transactions on Nuclear Science, vol. 43, Issue 6, Dec. 1996, IEEE, pp. 2874-2878.

Gaspard, N.J., et al., "Technology Scaling Comparison of Flip-Flop Heavy-Ion Single-Event Upset Cross Sections," IEEE Transactions on Nuclear Science, vol. 60, Issue 6, Dec. 2013, IEEE, pp. 4368-4373.

Gowan, Michael, et al., "Power Considerations in the Design of the Alpha 21264 Microprocessor," Proceedings of the Design Automation Conference, Jun. 1998, San Francisco, California, pp. 726-731.

Gujja, Aditya, et al., "Redundant Skewed Clocking of Pulse-clocked Latches for Low Power Soft Error Mitigation," European Conference on Radiation and Its Effects on Components and Systems, Sep. 14-18, 2015, Moscow, Russia, IEEE, 4 pages.

Hansen, David, et al., "Clock, Flip-Flop, and Combinatorial Logic Contributions to the SEU Cross Section in 90 nm ASIC Technology," IEEE Transactions on Nuclear Science, vol. 56, Issue 6, Dec. 2009, IEEE, pp. 3542-3550.

Karnik, Tanay, et al., "Characterization of Soft Errors Caused by Single Event Upsets in CMOS Processes," IEEE Transactions on Dependable and Secure Computing, vol. 1, Issue 2, Apr.-Jun. 2004, IEEE Computer Society, pp. 128-143.

Kumar, Sushil, et al., "Temporal Pulse-clocked Multi-bit Flip-flop Mitigating SET and SEU," International Symposium on Circuits and Systems, May 24-27, 2015, Lisbon, Portugal, IEEE, pp. 814-817.

Matush, Bradley, et al., "Area-Efficient Temporally Hardened by Design Flip-Flop Circuits," IEEE Transactions on Nuclear Science, vol. 57, Issue 6, Dec. 2010, IEEE, pp. 3588-3595.

Mavis, David, et al., "Soft Error Rate Mitigation Techniques for Modem Microcircuits," 40th Annual International Reliability Physics Symposium, 2002, Dallas, Texas, IEEE, pp. 216-225.

Naseer, Riaz, et al., "DF-DICE: A Scalable Solution for Soft Error Tolerant Circuit Design," International Symposium on Circuits and Systems, May 21-24, 2006, Island of Kos, Greece, IEEE, pp. 3890-3893.

Normand, Eugene, "Single Event Effects in Avionics," Presented to C-17 Program, Dec. 16, 1998, Boeing Radiation Effects Lab, 21 pages.

Rodbell, Kenneth, "Where Radiation Effects in Emerging Technologies Really Matter," Nuclear and Space Radiation Effects Conference, Short Course, Jul. 8-12, 2013, San Francisco, California, IEEE, 2 pages.

Shambhulingaiah, Sandeep, et al., "Methodology to Optimize Critical Node Separation in Hardened Flip-Flops," 15th International Symposium on Quality Electronic Design, Mar. 3-5, 2014, Santa Clara, California, IEEE, pp. 486-493.

Vittal, Ashok, et al., "Low-Power Buffered Clock Tree Design," IEEE Transactions on Computer-aided Design of Itegrated Circuits and Systems, vol. 16, Issue 9, Sep. 1997, IEEE, pp. 965-975.

Warren, Kevin, et al., "Heavy Ion Testing and Single Event Upset Rate Prediction Considerations for a DICE Flip-Flop," IEEE Transactions on Nuclear Science, vol. 56, Issue 6, Dec. 2009, IEEE, pp. 3130-3137.

Zhang, Ming, et al., "Sequential Element Design With Built-In Soft Error Resilience," IEEE Transactions on Very Large Scale Integration (VLSI) Systems, vol. 14, Issue 12, Dec. 2006, IEEE, pp. 1368-1378.

* cited by examiner

RADIATION HARDENED DIGITAL CIRCUIT

RELATED APPLICATIONS

This application claims the benefit of provisional patent application Ser. No. 62/028,669, filed Jul. 24, 2014, the disclosure of which is hereby incorporated herein by reference in its entirety.

FIELD OF THE DISCLOSURE

This disclosure relates generally to radiation hardened digital circuits.

BACKGROUND

State machines built from integrated circuits need to be radiation hardened to prevent soft errors that occur when a high energy particle travels through the integrated circuit's semiconductor substrate. This is particularly important when the state machine operates in high radiation environments such as outer space. An ionizing particle traveling through the semiconductor substrate may cause a transient voltage glitch, i.e., a single event transient (SET), or may cause a sequential state element to store the wrong state, i.e., a single event upset (SEU).

One technique for mitigating such effects of high energy radiation is to provide a self-correcting triple-mode redundant (TMR) circuit. In this manner, if a radiation strike results in a soft error in one copy of the circuit, the other two copies of the circuit can correct the soft error in the affected copy of the circuit through self-correction techniques. However, charge collection can affect clocking circuitry and in particular can cause a single event transient (SET) in the global clock signal. This can cause sampling at incorrect times thereby defeating the self-correcting mechanism of the redundancy. Therefore radiation hardening techniques are needed for clock signals as well as storage elements. Additionally, SETs may affect the state element inputs.

SUMMARY

This disclosure relates generally to radiation hardened digital circuits. In one embodiment, a radiation hardened digital circuit includes a delay network and a first Muller C element. The delay network is configured to receive a global clock signal and generate a first delayed clock signal from the global clock signal such that the first delayed clock signal is delayed with respect to the global clock signal. To provide a radiation hardened clock signal, the first Muller C element is configured to receive the global clock signal and the first delayed clock signal. The first Muller C element is further configured to generate a first clock input signal and set the first clock input signal to one of a set of clock states in response to the first delayed clock signal and the global clock signal each being provided in a same one of the set of clock states, wherein the set of clock states comprises a first clock state and a second clock state. Additionally, the first Muller C element is configured to hold the first clock input signal in the one of the set of clock states in response to the first delayed clock signal and the global clock signal being provided in different ones of the set of clock states. Thus, by not changing clock states unless the global clock signal and the first delayed clock signal are in the same clock state, a radiation strike is prevented from causing a soft error in the first clock input signal. As such, sequential state elements can be clocked with clock signals that are radiation hardened.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1A:
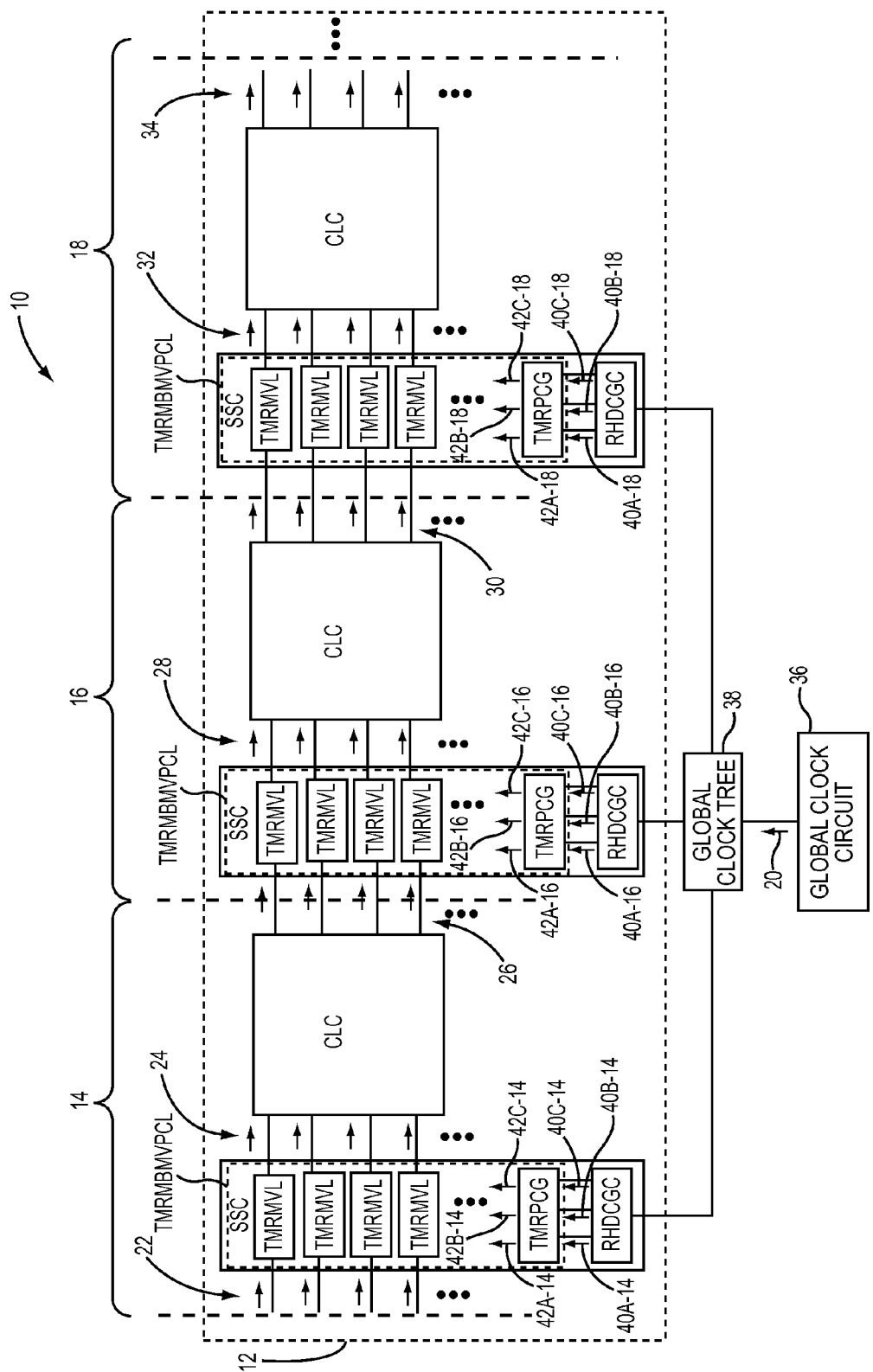
FIG. 1A illustrates an embodiment of a radiation hardened state machine with radiation hardened delayed clock generation circuitry within sequential state circuits.

FIG. 1A illustrates a block diagram of one embodiment of a radiation hardened state machine (RHSM) 10, which is an example of a radiation hardened digital circuit. The RHSM 10 includes a pipeline circuit 12. The pipeline circuit 12 is a finite state machine that has been radiation hardened. The operation of the finite state machine provided by the pipeline circuit 12 may be loosely analogized to an assembly line. More specifically, the pipeline circuit 12 has pipeline stages 14, 16, and 18. In the pipeline circuit 12, the different pipeline stages 14, 16, 18 each handle a different operation of the finite state machine so that the various operations of the finite state machine are handled essentially in series. Examples of operations that may be provided by the different pipeline stages 14, 16, 18 for the finite state machine include instruction fetch operations, instruction decode operations, encode operations, register file operations, fetch operations, instruction execution operations, data memory access operations, register file write back operations, and/or the like. As shown in FIG. 1A, each of the pipeline stages 14, 16, 18 in the pipeline circuit 12 includes a different combinational logic circuit (CLC) and a different sequential state circuit (SSC). In the pipeline circuit 12, the CLCs of the different pipeline stages 14, 16, 18 are specialized to handle the particular operation of each of the the pipeline stages 14, 16, 18. Accordingly, for each of the pipeline stages 14, 16, 18 in the pipeline circuit 12, the CLCs include an arrangement of combinational logic elements (i.e., logic gates) configured to provide logic that implements the operation of the pipeline stages 14, 16, 18. For example, static combinational elements and/or dynamic combinational elements may be utilized. While the pipeline circuit 12 shown in FIG. 1A has three pipeline stages 14, 16, 18, it should be noted that the RHSM 10 may include any number of pipeline stages. Additionally, feedback may exist between any of the pipeline stages. This may depend on the particular finite state machine to be provided for the particular application. Furthermore, the RHSM 10 shown in FIG. 1A has been simplified for the purposes of describing relevant concepts related to the application.

To synchronize the pipeline stages 14, 16, 18 of the pipeline circuit 12, the SSCs coordinate transfer of valid states between the different pipeline stages 14, 16, 18 in accordance with a global clock signal 20, as explained in further detail below. More specifically, the global clock signal 20 is received by the pipeline circuit 12. In this particular embodiment, the pipeline circuit 12 is assumed to be arranged in a single-phase clock style so that each of the SSCs in the different pipeline stages 14, 16, 18 receives versions of the same global clock signal 20. Alternatively, multiple-phase clock styles may be used where different versions of the global clock signal 20 are provided having different phases. This may depend, for example, on the particular clock distribution technique used for the RHSM 10. When multiple-phase clock styles are implemented, each of the SSCs in the different pipeline stages 14, 16, 18 may receive a different version of the global clock signal 20 within each of the pipeline circuits 12. Additionally, when the CLCs are implemented using dynamic combinational elements, coordination of precharging may be coordinated by different clock signals if desired.

The SSC in the pipeline stage 14 receives a data input 22. Based on the data input 22, the SSC is synchronized using the global clock signal 20 in the pipeline stage 14 of the pipeline circuit 12 in order to generate a data output 24. In this embodiment, the data input 22 for the pipeline stage 14 includes a plurality of input bit signals that provide the various bits of the data input 22. Accordingly, the data output 24 from the SSC of the pipeline stage 14 includes a plurality of output bit signals that provide the various bits of the data output 24. In this embodiment, the SSC in the pipeline stage 14 includes a triple mode redundant multi-bit majority voted pulsed clock latch (TMRMBMVPCL) that receives the data input 22 and generates the data output 24, as explained in further detail below.

The CLC of the pipeline stage 14 performs a designated pipeline operation in accordance with its logical arrangement to generate a data input 26 for the next pipeline stage 16.

It should be noted that the data input 22 may have any number of input bit signals, depending on a data type. The data input 26 may also have any number of input bit signals, depending on the data type. However, the data input 22 and the data input 26 may have different numbers of input bit signals, since the data types of the data input 22 and the data input 26 may be different. To illustrate one non-limiting example, if the pipeline stage 14 provides a decoding operation, the number of input bit signals in the data input 22 would be greater than the number of input bit signals in the data input 26. In another non-limiting example, if the pipeline stage 14 provides an encoding operation, the number of input bit signals in the data input 22 would be less than the number of input bit signals in the data input 26.

The SSC in the pipeline stage 16 receives the data input 26 from the previous pipeline stage 14. Based on the data input 26, the SSC is synchronized using the global clock signal 20 in the pipeline stage 16 in order to generate a data output 28. As mentioned above, the data input 26 for the pipeline stage 16 includes a plurality of input bit signals that provide the various bits of the data input 26. Accordingly, the data output 28 from the SSC of the pipeline stage 16 includes a plurality of output bit signals that provide the various bits of the data output 28. In this embodiment, the SSC in the pipeline stage 16 includes a TMRMBMVPCL that receives the data input 26 and generates the data output 28, as explained in further detail below.

The CLC of the pipeline stage 16 performs the designated pipeline operation in accordance with its logical arrangement to generate a data input 30 for the next pipeline stage 18. The data input 26 and the data input 30 may or may not have different numbers of input bit signals, depending on their data types.

The SSC in the pipeline stage 18 receives the data input 30 from the previous pipeline stage 16. Based on the data input 30, the SSC is synchronized using the global clock signal 20 in the pipeline stage 18 in order to generate a data output 32. In FIG. 1A, the data input 30 for the pipeline stage 18 includes a plurality of input bit signals that provide the various bits of the data input 30. Accordingly, the data output 32 from the SSC of the pipeline stage 18 includes a plurality of output bit signals that provide the various bits of the data output 32. In this embodiment, the SSC in the pipeline stage 18 includes a TMRMBMVPCL that receives the data input 30 and generates the data output 32, as explained in further detail below. The CLC of the pipeline stage 18 performs a designated pipeline operation in accordance with its logical arrangement to generate a data input 34. The data input 30 and the data input 34 may or may not have different numbers of input bit signals, depending on their data types.

As mentioned above, different embodiments of the RHSM 10 may have any number of pipeline stages. For instance, the data input 34 may be transmitted externally to one or more external devices or may be provided to pipeline stages downstream from the pipeline stage 18. Similarly, the data input 22 for the pipeline stage 14 may be received from external devices or may be received from upstream pipeline stages. In fact, any design for a finite state machine may be used as a design for an embodiment of the RHSM 10. In this embodiment, each of the SSCs in the different pipeline stages 14, 16, 18 is radiation hardened and thus each is an example of a radiation hardened digital circuit. Since the RHSM 10 includes SSCs that are radiation hardened, the RHSM 10 is a radiation hardened digital circuit.

As described above, each of the SSCs is synchronized using the global clock signal 20. The global clock signal 20 oscillates between a set of clock states. Generally, the set of clock states includes a first clock state and a second clock state, such as a high clock state and a low clock state. The global clock signal 20 may thus be provided as a temporal series of clock pulses. The global clock signal 20 provides the temporal series of clock pulses in a standard temporal clock format. Thus, the global clock signal 20 in this embodiment is approximately isochronous and has approximately a 50% duty cycle. Accordingly, the global clock signal 20 has a substantial time period of oscillation, which defines a temporal duration of each clock cycle. Furthermore, during each clock cycle, the global clock signal 20 provides a clock pulse for approximately 50% of the temporal duration of each clock cycle, and thus the global clock signal 20 is in the first clock state for approximately 50% of the temporal duration of each clock cycle and in the second clock state for approximately 50% of the temporal duration of each clock cycle.

The RHSM 10 includes a global clock circuit 36 configured to generate and regulate the global clock signal 20. The global clock circuit 36 may include a crystal oscillator, such as a quartz piezoelectric oscillator, configured to generate the global clock signal 20. Performance monitoring circuitry and phase adjustment circuitry may also be provided in the global clock circuit 36 in order to regulate the global clock signal 20. The RHSM 10 includes a global clock tree 38 coupled to each of the SSCs. The global clock tree 38 includes clock paths that distribute clock signal to the SSCs of the different pipeline stages 14, 16, 18. In this embodiment, the global clock circuit 36 is coupled to the global clock tree 38 so that the global clock signal 20 is provided to each of the SSCs of the different pipeline stages 14, 16, 18.

In this embodiment, each of the SSCs includes a radiation hardened delay clock generation circuit (RHDCGC). More specifically, the SSC in the pipeline stage 14 includes an RHDCGC. The RHDCGC is coupled to the global clock tree 38 and is configured to receive the global clock signal 20. The RHDCGC is configured to provide a first clock input signal 40A-14, a second clock input signal 40B-14 that is delayed with respect to the first clock input signal 40A-14, and a third clock input signal 40C-14 that is delayed with respect to the second clock input signal 40B-14 and has an even greater delay with respect to the first clock input signal 40A-14. For example, the second clock input signal 40B-14 is delayed with respect to the first clock input signal 40A-14 by delay duration, and the third clock input signal 40C-14 is delayed with respect to the second clock input signal 40B-14 by approximately the same delay duration. Accordingly, the third clock input signal 40C-14 is delayed with respect to the first clock input signal 40A-14 by approximately double the delay duration.

The RHDCGC is configured to protect a radiation strike from resulting in a soft error in at least two of the clock input signals 40A-14, 40B-14, 40C-14. In one exemplary embodiment, the RHDCGC is configured to generate the first clock input signal 40A-14, the second clock input signal 40B-14, and the third clock input signal 40C-14 from the global clock signal 20. Each of the clock input signals 40A-14, 40B-14, 40C-14 provides the temporal series of clock pulses in a standard temporal clock format. Thus, each of the clock input signals 40A-14, 40B-14, 40C-14 has the substantially the same time period of oscillation as the global clock signal 20, which defines a temporal duration of each clock cycle of each of the clock input signals 40A-14, 40B-14, 40C-14.

Furthermore, during each clock cycle of each of the clock input signals 40A-14, 40B-14, 40C-14, each of the clock input signals 40A-14, 40B-14, 40C-14 provides a clock pulse for approximately 50% of the temporal duration of each clock cycle, and thus each of the clock input signals 40A-14, 40B-14, 40C-14 is in the first clock state for approximately 50% of the temporal duration of each clock cycle and in the second clock state for approximately 50% of the temporal duration of each clock cycle. Thus, each of the clock input signals 40A-14, 40B-14, 40C-14 has a 50% duty cycle. However, the clock cycles, and thus the clock pulses, of the second clock input signal 40B-14 are delayed with respect to the clock cycles, and thus the clock pulses, of the first clock input signal 40A-14. Additionally, the clock cycles, and thus the clock pulses, of the third clock input signal 40C-14 are delayed with respect to the clock cycles, and thus the clock pulses, of the second clock input signal 40B-14. Accordingly, the clock cycles, and thus the clock pulses, of the third clock input signal 40C-14 have an even greater delay with respect to the clock cycles, and thus the clock pulses, of the first clock input signal 40A-14. It should be noted that in this exemplary embodiment, the first clock input signal 40A-14 may be delayed with respect to the global clock signal 20 Also, in the exemplary embodiment, the RHDCGC is configured to protect a radiation strike from resulting in a soft error in the first clock input signal 40A-14, in the second clock input signal 40B-14, and in the third clock input signal 40C-14. The RHDCGC is thus a radiation hardened digital circuit.

In an alternative exemplary embodiment, the RHDCGC is configured to pass the global clock signal 20 as the first clock input signal 40A-14 and generate the first clock input signal 40A-14, the second clock input signal 40B-14, and the third clock input signal 40C-14 from the global clock signal 20. The first clock input signal 40A-14, the second clock input signal 40B-14, and the third clock input signal 40C-14 are delayed in the same manner described above for the other exemplary embodiment described above. However, since the first clock input signal 40A-14 is provided as the global clock signal 20, the first clock input signal 40A-14 is not delayed with respect to the global clock signal 20. Furthermore, since the RHDCGC simply passes the global clock signal 20 as the first clock input signal 40A-14, the RHDCGC is only configured to protect a radiation strike from resulting in a soft error in the second clock input signal 40B-14 and in the third clock input signal 40C-14 but not in the first clock input signal 40A-14. The RHDCGC is thus a radiation hardened digital circuit.

The TMRMBMVPCL in the SSC of the pipeline stage 14 is coupled to the RHDCGC in the SSC of the pipeline stage 14 so as to receive the first clock input signal 40A-14, the second clock input signal 40B-14, and the third clock input signal 40C-14. More specifically, the TMRMBMVPCL includes a triple mode redundant pulse clock generator TMRPCG. The TMRPCG is configured to generate a first pulsed clock signal 42A-14 from the first clock input signal 40A-14, a second pulsed clock signal 42B-14 from the second clock input signal 40B-14, and a third pulsed clock signal 42C-14 from the third clock input signal 40C-14. Since the first pulsed clock signal 42A-14 is generated from the first clock input signal 40A-14, the second pulsed clock signal 42B-14 is generated from the second clock input signal 40B-14, and the third pulsed clock signal 42C-14 is generated from the third clock input signal 40C-14, the TMRPCG provides the second pulsed clock signal 42B-14 such that the second pulsed clock signal 42B-14 is delayed with respect to the first pulsed clock signal 42A-14, and provides the third pulsed clock signal 42C-14 such that the third pulsed clock signal 42C-14 is delayed with respect to the second pulsed clock signal 42B-14 and has an even greater delay with respect to the first pulsed clock signal 42A-14. For example, the second pulsed clock signal 42B-14 is delayed with respect to the first pulsed clock signal 42A-14 by the delay duration, and the third pulsed clock signal 42C-14 is delayed with respect to the second pulsed clock signal 42B-14 by approximately the same delay duration. Accordingly, the third pulsed clock signal 42C-14 is delayed with respect to the first pulsed clock signal 42A-14 by approximately double the delay duration.

Each of the pulsed clock signals 42A-14, 42B-14, 42C-14 provides a temporal series of clock pulses in a pulsed temporal clock format. Each of the pulsed clock signals 42A-14, 42B-14, 42C-14 has substantially the same time period of oscillation as the global clock signal 20, which defines a temporal duration of each clock cycle of each of the pulsed clock signals 42A-14, 42B-14, 42C-14. However, during each clock cycle of each of the pulsed clock signals 42A-14, 42B-14, 42C-14, each of the pulsed clock signals 42A-14, 42B-14, 42C-14 provides a clock pulse for much less than 50% of the temporal duration of each clock cycle, and thus each of the pulsed clock signals 42A-14, 42B-14, 42C-14 is in the clock state of the clock pulse for approximately much less than 50% of the temporal duration of each clock cycle and in the other clock state for the remainder of the temporal duration of each clock cycle. Thus, each of the pulsed clock signals 42A-14, 42B-14, 42C-14 has a duty cycle that is much less than 50%. Furthermore, the clock cycles, and thus the clock pulses, of the second pulsed clock signal 42B-14 are delayed with respect to the clock cycles, and thus the clock pulses, of the first pulsed clock signal 42A-14. Additionally, the clock cycles, and thus the clock pulses, of the third pulsed clock signal 42C-14 are delayed with respect to the clock cycles, and thus the clock pulses, of the second pulsed clock signal 42B-14. Accordingly, the clock cycles, and thus the clock pulses, of the third pulsed clock signal 42C-14 have an even greater delay with respect to the clock cycles, and thus the clock pulses, of the first pulsed clock signal 42A-14. It should be noted that in this exemplary embodiment, the first pulsed clock signal 42A-14 may be delayed with respect to the global clock signal 20.

The TMRMBMVPCL of the SSC of the pipeline stage 14 includes a plurality of triple mode redundant majority voted latches (TMRMVL). Each of the TMRMVLs is configured to receive a different one of the input bit signals in the data input 22 and generate a different one of the output bit signals in the data output 24. Furthermore, each of the TMRMVLs is coupled to the TMRPCG so that each of the TMRMVLs in the TMRMBMVPCL is configured to receive the first pulsed clock signal 42A-14, the second pulsed clock signal 42B-14, and the third pulsed clock signal 42C-14 from the TMRPCG. As explained in further detail below, each of the TMRMVLs includes three redundant pulse latches. A first one of the pulse latches in each of the TMRMVLs is configured to receive the first pulsed clock signal 42A-14, a second one of the pulse latches in each of the TMRMVLs is configured to receive the second pulsed clock signal 42B-14, and a third one of the pulse latches in each of the TMRMVLs is configured to receive the third pulsed clock signal 42C-14. Each of the three redundant pulse latches in each of the TMRMVLs is configured to receive the same input bit signal from the data input 22.

The first one of the pulse latches in each of the TMRMVLs is configured to sample an input bit state of the input bit signal in response to a clock pulse in the first pulsed clock signal 42A-14 and generate a first output bit signal having a first output bit state set in accordance to the input bit state of the input bit signal received by the first pulsed clock signal 42A-14. While a clock pulse is not being provided by the first pulsed clock signal 42A-14, the first output bit state of the first output bit signal is held and thus not affected by the input bit state. The second one of the pulse latches in each of the TMRMVLs is configured to sample an input bit state of the input bit signal in response to a clock pulse in the second pulsed clock signal 42B-14 and generate a second output bit signal having a second output bit state set in accordance to the input bit state of the input bit signal received by the second pulsed clock signal 42B-14. While a clock pulse is not being provided by the second pulsed clock signal 42B-14, the second output bit state of the second output bit signal is held and thus not affected by the input bit state. The third one of the pulse latches in each of the TMRMVLs is configured to sample an input bit state of the input bit signal in response to a clock pulse in the third pulsed clock signal 42C-14 and generate a third output bit signal having a third output bit state set in accordance to the input bit state of the input bit signal received by the third pulsed clock signal 42C-14. While a clock pulse is not being provided by the third pulsed clock signal 42C-14, the third output bit state of the third output bit signal is held and thus not affected by the input bit state.

Each of the TMRMVLs in the TMRMBMVPCL of the SSC of the pipeline stage 14 further includes a majority gate, as explained in further detail below. The majority gate is configured to generate a resultant output bit signal having a resultant output bit state set in accordance with a majority bit state of the first output bit state of the first output bit signal from the first one of the redundant latches, the second output bit state of the second output bit signal from the second one of the redundant latches, and the third output bit state of the third output bit signal from the third one of the redundant latches. The resultant output bit signal is provided as one of the output bit signals of the data output 24. By providing majority voting, the TMRMVL protects a radiation strike at one of the three redundant latches from resulting in a soft error in the resultant output bit signal.

Furthermore, since the first pulsed clock signal 42A-14, the second pulsed clock signal 42B-14, and the third pulsed clock signal 42C-14 are delayed with respect to one another, a soft error in the input bit signal does not result in a soft error in the resultant bit state, so long as the soft error is not longer than the delay between the first pulsed clock signal 42A-14 and the second pulsed clock signal 42B-14, and between the second pulsed clock signal 42B-14 and the third pulsed clock signal 42C-14. In other words, by setting the delay duration between the first pulsed clock signal 42A-14 and the second pulsed clock signal 42B-14, and the delay duration between the second pulsed clock signal 42B-14 and the third pulsed clock signal 42C-14 so as to (with a very high probability) each be longer than a soft error in the input bit signal, then no more than one of the three redundant latches will sample the soft error in the input bit signal. Furthermore, the RHDCGC of the pipeline stage 14 protects a soft error in the global clock signal 20 from causing more than two of the pulsed clock signals 42A-14, 42B-14, 42C-14 from having a soft error. This protects more than one of the three redundant pulsed clock latches in each of the TMRMVLs in the TMRMBMVPCL of the SSC of the pipeline stage 14 from sampling the input bit state of the input bit signal inappropriately and thus protects a soft error in the resultant output bit state of the resultant output bit signal.

With regard to the SSC of the pipeline stage 16, the SSC in the pipeline stage 16 includes an RHDCGC. The RHDCGC is coupled to the global clock tree 38 and is configured to receive the global clock signal 20. The RHDCGC is configured to provide a first clock input signal 40A-16, a second clock input signal 40B-16 that is delayed with respect to the first clock input signal 40A-16, and a third clock input signal 40C-16 that is delayed with respect to the second clock input signal 40B-16 and has an even greater delay with respect to the first clock input signal 40A-16. For example, the second clock input signal 40B-16 is delayed with respect to the first clock input signal 40A-16 by delay duration and the third clock input signal 40C-16 that is delayed with respect to the second clock input signal 40B-16 by approximately the same delay duration. Accordingly, the third clock input signal 40C-16 is delayed with respect to the first clock input signal 40A-16 by approximately double the delay duration.

The RHDCGC is configured to protect a radiation strike from resulting in a soft error in at least two of the clock input signals 40A-16, 40B-16, 40C-16. In one exemplary embodiment, the RHDCGC is configured to generate the first clock input signal 40A-16, the second clock input signal 40B-16, and the third clock input signal 40C-16 from the global clock signal 20. Each of the clock input signals 40A-16, 40B-16, 40C-16 provides the temporal series of clock pulses in a standard temporal clock format. Thus, each of the clock input signals 40A-16, 40B-16, 40C-16 has the substantially the same time period of oscillation as the global clock signal 20, which defines a temporal duration of each clock cycle of each of the clock input signals 40A-16, 40B-16, 40C-16.

Furthermore, during each clock cycle of each of the clock input signals 40A-16, 40B-16, 40C-16, each of the clock input signals 40A-16, 40B-16, 40C-16 provides a clock pulse for approximately 50% of the temporal duration of each clock cycle and thus each of the clock input signals 40A-16, 40B-16, 40C-16 is in the first clock state for approximately 50% of the temporal duration of each clock cycle and in the second clock state for approximately 50% of the temporal duration of each clock cycle. Thus, each of the clock input signals 40A-16, 40B-16, 40C-16 has a 50% duty cycle. However, the clock cycles, and thus the clock pulses, of the second clock input signal 40B-16 are delayed with respect to the clock cycles, and thus the clock pulses, of the first clock input signal 40A-16. Additionally, the clock cycles, and thus the clock pulses, of the third clock input signal 40C-16 are delayed with respect to the clock cycles, and thus the clock pulses, of the second clock input signal 40B-16. Accordingly, the clock cycles, and thus the clock pulses, of the third clock input signal 40C-16 have an even greater delay with respect to the clock cycles, and thus the clock pulses, of the first clock input signal 40A-16. It should be noted that in this exemplary embodiment, the first clock input signal 40A-16 may be delayed with respect to the global clock signal 20. Also, in the exemplary embodiment, the RHDCGC is configured to protect a radiation strike from resulting in a soft error in the first clock input signal 40A-16, in the second clock input signal 40B-16, and in the third clock input signal 40C-16. The RHDCGC is thus a radiation hardened digital circuit.

In an alternative exemplary embodiment, the RHDCGC is configured to pass the global clock signal 20 as the first clock input signal 40A-16 and generate the first clock input signal 40A-16, the second clock input signal 40B-16, and the third clock input signal 40C-16 from the global clock signal 20. The first clock input signal 40A-16, the second clock input signal 40B-16, and the third clock input signal 40C-16 are delayed in the same manner described above for the other exemplary embodiment described above. However, since the first clock input signal 40A-16 is provided as the global clock signal 20, the first clock input signal 40A-16 is not delayed with respect to the global clock signal 20. Furthermore, since the RHDCGC simply passes the global clock signal 20 as the first clock input signal 40A-16, the RHDCGC is only configured to protect a radiation strike from resulting in a soft error in the second clock input signal 40B-16 and in the third clock input signal 40C-16 but not in the first clock input signal 40A-16. The RHDCGC is thus a radiation hardened digital circuit.

The TMRMBMVPCL in the SSC of the pipeline stage 16 is coupled to the RHDCGC in the SSC of the pipeline stage 16 so as to receive the first clock input signal 40A-16, the second clock input signal 40B-16 and the third clock input signal 40C-16. More specifically, the TMRMBMVPCL includes a triple mode redundant pulse clock generator TMRPCG. The TMRPCG is configured to generate a first pulsed clock signal 42A-16 from the first clock input signal 40A-16, a second pulsed clock signal 42B-16 from the second clock input signal 40B-16, and a third pulsed clock signal 42C-16 from the third clock input signal 40C-16. Since the first pulsed clock signal 42A-16 is generated from the first clock input signal 40A-16, the second pulsed clock signal 42B-16 is generated from the second clock input signal 40B-16, and the third pulsed clock signal 42C-16 is generated from the third clock input signal 40C-16, the TMRPCG provides the second pulsed clock signal 42B-16 such that the second pulsed clock signal 42B-16 is delayed with respect to the first pulsed clock signal 42A-16, and provides the third pulsed clock signal 42C-16 such that the third pulsed clock signal 42C-16 is delayed with respect to the second pulsed clock signal 42B-16 and has an even greater delay with respect to the first pulsed clock signal 42A-16. For example, the second pulsed clock signal 42B-16 is delayed with respect to the first pulsed clock signal 42A-16 by the delay duration, and the third pulsed clock signal 42C-16 is delayed with respect to the second pulsed clock signal 42B-16 by approximately the same delay duration. Accordingly, the third pulsed clock signal 42C-16 is delayed with respect to the first pulsed clock signal 42A-16 by approximately double the delay duration.

Each of the pulsed clock signals 42A-16, 42B-16, 42C-16 provides a temporal series of clock pulses in a pulsed temporal clock format. Each of the pulsed clock signals 42A-16, 42B-16, 42C-16 has the substantially the same time period of oscillation as the global clock signal 20, which defines a temporal duration of each clock cycle of each of the pulsed clock signals 42A-16, 42B-16, 42C-16. However, during each clock cycle of each of the pulsed clock signals 42A-16, 42B-16, 42C-16, each of the pulsed clock signals 42A-16, 42B-16, 42C-16 provides a clock pulse for much less than 50% of the temporal duration of each clock cycle, and thus each of the pulsed clock signals 42A-16, 42B-16, 42C-16 is in the clock state of the clock pulse for approximately much less than 50% of the temporal duration of each clock cycle and in the other clock state for the remainder of the temporal duration of each clock cycle. Thus, each of the pulsed clock signals 42A-16, 42B-16, 42C-16 has a duty cycle that is much less than 50%. Furthermore, the clock cycles, and thus the clock pulses, of the second pulsed clock signal 42B-16 are delayed with respect to the clock cycles, and thus the clock pulses, of the first pulsed clock signal 42A-16. Additionally, the clock cycles, and thus the clock pulses, of the third pulsed clock signal 42C-16 are delayed with respect to the clock cycles, and thus the clock pulses, of the second pulsed clock signal 42B-16. Accordingly, the clock cycles, and thus the clock pulses, of the third pulsed clock signal 42C-16 have an even greater delay with respect to the clock cycles, and thus the clock pulses, of the first pulsed clock signal 42A-16. It should be noted that in this exemplary embodiment, the first pulsed clock signal 42A-16 may be delayed with respect to the global clock signal 20.

The TMRMBMVPCL of the SSC of the pipeline stage 16 includes a plurality of triple mode redundant majority voted latches (TMRMVL). Each of the TMRMVLs is configured to receive a different one of the input bit signals in the data input 26 and generate a different one of the output bit signals in the data output 28. Furthermore each of the TMRMVLs is coupled to the TMRPCG so that each of the TMRMVLs in the TMRMBMVPCL is configured to receive the first pulsed clock signal 42A-16, the second pulsed clock signal 42B-16, and the third pulsed clock signal 42C-16 from the TMRPCG. As explained in further detail below, each of the TMRMVLs include three redundant pulse latches. A first one of the pulse latches in each of the TMRMVLs is configured to receive the first pulsed clock signal 42A-16, a second one of the pulse latches in each of the TMRMVLs is configured to receive the second pulsed clock signal 42B-16, and a third one of the pulse latches in each of the TMRMVLs is configured to receive the third pulsed clock signal 42C-16. Each of the three redundant pulse latches in each of the TMRMVLs is configured to receive the same input bit signal from the data input 26.

The first one of the pulse latches in each of the TMRM-VLs is configured to sample an input bit state of the input bit signal in response to a clock pulse in the first pulsed clock signal 42A-16 and generate a first output bit signal having a first output bit state set in accordance to the input bit state of the input bit signal received by the first pulsed clock signal 42A-16. While a clock pulse is not being provided by the first pulsed clock signal 42A-16, the first output bit state of the first output bit signal is held and thus not affected by the input bit state. The second one of the pulse latches in each of the TMRMVLs is configured to sample an input bit state of the input bit signal in response to a clock pulse in the second pulsed clock signal 42B-16 and generate a second output bit signal having a second output bit state set in accordance to the input bit state of the input bit signal received by the second pulsed clock signal 42B-16. While a clock pulse is not being provided by the second pulsed clock signal 42B-16, the second output bit state of the second output bit signal is held and thus not affected by the input bit state. The third one of the pulse latches in each of the TMRMVLs is configured to sample an input bit state of the input bit signal in response to a clock pulse in the third pulsed clock signal 42C-16 and generate a third output bit signal having a third output bit state set in accordance to the input bit state of the input bit signal received by the third pulsed clock signal 42C-16. While a clock pulse is not being provided by the third pulsed clock signal 42C-16, the third output bit state of the third output bit signal is held and thus not affected by the input bit state.

Each of the TMRMVLs in the TMRMBMVPCL of the SSC of the pipeline stage 16 further includes a majority gate, as explained in further detail below. The majority gate is configured to generate a resultant output bit signal having a resultant output bit state set in accordance with a majority bit state of the first output bit state of the first output bit signal from the first one of the redundant latches, the second output bit state of the second output bit signal from the second one of the redundant latches, and the third output bit state of the third output bit signal from the third one of the redundant latches. The resultant output bit signal is provided as one of the output bit signals of the data output 28. By providing majority voting, the TMRMVL protects a radiation strike at one of the three redundant latches from resulting in a soft error in the resultant output bit signal.

With regard to the SSC in the pipeline stage 18, the SSC in the pipeline stage 18 includes an RHDCGC. The RHDCGC is coupled to the global clock tree 38 and is configured to receive the global clock signal 20. The RHDCGC is configured to provide a first clock input signal 40A-18, a second clock input signal 40B-18 that is delayed with respect to the first clock input signal 40A-18, and a third clock input signal 40C-18 that is delayed with respect to the second clock input signal 40B-18 and has an even greater delay with respect to the first clock input signal 40A-18. For example, the second clock input signal 40B-18 is delayed with respect to the first clock input signal 40A-18 by delay duration and the third clock input signal 40C-18 that is delayed with respect to the second clock input signal 40B-18 by approximately the same delay duration. Accordingly, the third clock input signal 40C-18 is delayed with respect to the first clock input signal 40A-18 by approximately double the delay duration.

The RHDCGC is configured to protect from a radiation strike resulting in aSET in at least two of the clock input signals 40A-18, 40B-18, 40C-18. In one exemplary embodiment, the RHDCGC is configured to generate the first clock input signal 40A-18, the second clock input signal 40B-18, and the third clock input signal 40C-18 from the global clock signal 20. Each of the clock input signals 40A-18, 40B-18, 40C-18 provides the temporal series of clock pulses in a standard temporal clock format. Thus, each of the clock input signals 40A-18, 40B-18, 40C-18 has the substantially the same time period of oscillation as the global clock signal 20, which defines a temporal duration of each clock cycle of each of the clock input signals 40A-18, 40B-18, 40C-18.

Furthermore, during each clock cycle of each of the clock input signals 40A-18, 40B-18, 40C-18, each of the clock input signals 40A-18, 40B-18, 40C-18 provides a clock pulse for approximately 50% of the temporal duration of each clock cycle and thus each of the clock input signals 40A-18, 40B-18, 40C-18 is in the first clock state for approximately 50% of the temporal duration of each clock cycle and in the second clock state for approximately 50% of the temporal duration of each clock cycle. Thus, each of the clock input signals 40A-18, 40B-18, 40C-18 has a 50% duty cycle. However, the clock cycles, and thus the clock pulses, of the second clock input signal 40B-18 are delayed with respect to the clock cycles, and thus the clock pulses, of the first clock input signal 40A-18. Additionally, the clock cycles, and thus the clock pulses, of the third clock input signal 40C-18 are delayed with respect to the clock cycles, and thus the clock pulses, of the second clock input signal 40B-18. Accordingly, the clock cycles, and thus the clock pulses, of the third clock input signal 40C-18 have an even greater delay with respect to the clock cycles, and thus the clock pulses, of the first clock input signal 40A-18. It should be noted that in this exemplary embodiment, the first clock input signal 40A-18 may be delayed with respect to the global clock signal 20 Also, in the exemplary embodiment, the RHDCGC is configured to protect a radiation strike from resulting in a soft error in the first clock input signal 40A-18, in the second clock input signal 40B-18, and in the third clock input signal 40C-18. The RHDCGC is thus a radiation hardened digital circuit.

In an alternative exemplary embodiment, the RHDCGC is configured to pass the global clock signal 20 as the first clock input signal 40A-18 and generate the first clock input signal 40A-18, the second clock input signal 40B-18, and the third clock input signal 40C-18 from the global clock signal 20. The first clock input signal 40A-18, the second clock input signal 40B-18, and the third clock input signal 40C-18 are delayed in the same manner described above for the other exemplary embodiment described above. However, since the first clock input signal 40A-18 is provided as the global clock signal 20, the first clock input signal 40A-18 is not delayed with respect to the global clock signal 20. Furthermore, since the RHDCGC simply passes the global clock signal 20 as the first clock input signal 40A-18, the RHDCGC is only configured to protect a radiation strike from resulting in a soft error in the second clock input signal 40B-18 and in the third clock input signal 40C-18 but not in the first clock input signal 40A-18. The RHDCGC is thus a radiation hardened digital circuit.

The TMRMBMVPCL in the SSC of the pipeline stage 18 is coupled to the RHDCGC in the SSC of the pipeline stage 18 so as to receive the first clock input signal 40A-18, the second clock input signal 40B-18 and the third clock input signal 40C-18. More specifically, the TMRMBMVPCL includes a triple mode redundant pulse clock generator TMRPCG. The TMRPCG is configured to generate a first pulsed clock signal 42A-18 from the first clock input signal 40A-18, a second pulsed clock signal 42B-18 from the second clock input signal 40B-18, and a third pulsed clock signal 42C-18 from the third clock input signal 40C-18. Since the first pulsed clock signal 42A-18 is generated from the first clock input signal 40A-18, the second pulsed clock signal 42B-18 is generated from the second clock input signal 40B-18, and the third pulsed clock signal 42C-18 is generated from the third clock input signal 40C-18, the TMRPCG provides the second pulsed clock signal 42B-18 such that the second pulsed clock signal 42B-18 is delayed with respect to the first pulsed clock signal 42A-18, and provides the third pulsed clock signal 42C-18 such that the third pulsed clock signal 42C-18 is delayed with respect to the second pulsed clock signal 42B-18 and has an even greater delay with respect to the first pulsed clock signal 42A-18. For example, the second pulsed clock signal 42B-18 is delayed with respect to the first pulsed clock signal 42A-18 by the delay duration and the third pulsed clock signal 42C-18 is delayed with respect to the second pulsed clock signal 42B-18 by approximately the same delay duration. Accordingly, the third pulsed clock signal 42C-18 is delayed with respect to the first pulsed clock signal 42A-18 by approximately double the delay duration.

Each of the pulsed clock signals 42A-18, 42B-18, 42C-18 provides a temporal series of clock pulses in a pulsed temporal clock format. Each of the pulsed clock signals 42A-18, 42B-18, 42C-18 has the substantially the same time period of oscillation as the global clock signal 20, which defines a temporal duration of each clock cycle of each of the pulsed clock signals 42A-18, 42B-18, 42C-18. However, during each clock cycle of each of the pulsed clock signals 42A-18, 42B-18, 42C-18, each of the pulsed clock signals 42A-18, 42B-18, 42C-18 provides a clock pulse for much less than 50% of the temporal duration of each clock cycle, and thus each of the pulsed clock signals 42A-18, 42B-18, 42C-18 is in the clock state of the clock pulse for approximately much less than 50% of the temporal duration of each clock cycle and in the other clock state for the remainder of the temporal duration of each clock cycle. Thus, each of the pulsed clock signals 42A-18, 42B-18, 42C-18 has a duty cycle that is much less than 50%. Furthermore, the clock cycles, and thus the clock pulses, of the second pulsed clock signal 42B-18 are delayed with respect to the clock cycles, and thus the clock pulses, of the first pulsed clock signal 42A-18. Additionally, the clock cycles, and thus the clock pulses, of the third pulsed clock signal 42C-18 are delayed with respect to the clock cycles, and thus the clock pulses, of the second pulsed clock signal 42B-18. Accordingly, the clock cycles, and thus the clock pulses, of the third pulsed clock signal 42C-18 have an even greater delay with respect to the clock cycles, and thus the clock pulses, of the first pulsed clock signal 42A-18. It should be noted that in this exemplary embodiment, the first pulsed clock signal 42A-18 may be delayed with respect to the global clock signal 20.

The TMRMBMVPCL of the SSC of the pipeline stage 18 includes a plurality of triple mode redundant majority voted latches (TMRMVL). Each of the TMRMVLs is configured to receive a different one of the input bit signals in the data input 30 and generate a different one of the output bit signals in the data output 32. Furthermore, each of the TMRMVLs is coupled to the TMRPCG so that each of the TMRMVLs in the TMRMBMVPCL is configured to receive the first pulsed clock signal 42A-18, the second pulsed clock signal 42B-18, and the third pulsed clock signal 42C-18 from the TMRPCG. As explained in further detail below, each of the TMRMVLs includes three redundant pulse latches. A first one of the pulse latches in each of the TMRMVLs is configured to receive the first pulsed clock signal 42A-18, a second one of the pulse latches in each of the TMRMVLs is configured to receive the second pulsed clock signal 42B-18, and a third one of the pulse latches in each of the TMRMVLs is configured to receive the third pulsed clock signal 42C-18. Each of the three redundant pulse latches in each of the TMRMVLs is configured to receive the same input bit signal from the data input 30.

The first one of the pulse latches in each of the TMRMVLs is configured to sample an input bit state of the input bit signal in response to a clock pulse in the first pulsed clock signal 42A-18 and generate a first output bit signal having a first output bit state set in accordance to the input bit state of the input bit signal received by the first pulsed clock signal 42A-18. While a clock pulse is not being provided by the first pulsed clock signal 42A-18, the first output bit state of the first output bit signal is held and thus not affected by the input bit state. The second one of the pulse latches in each of the TMRMVLs is configured to sample an input bit state of the input bit signal in response to a clock pulse in the second pulsed clock signal 42B-18 and generate a second output bit signal having a second output bit state set in accordance to the input bit state of the input bit signal received by the second pulsed clock signal 42B-18. While a clock pulse is not being provided by the second pulsed clock signal 42B-18, the second output bit state of the second output bit signal is held and thus not affected by the input bit state. The third one of the pulse latches in each of the TMRMVLs is configured to sample an input bit state of the input bit signal in response to a clock pulse in the third pulsed clock signal 42C-18 and generate a third output bit signal having a third output bit state set in accordance to the input bit state of the input bit signal received by the third pulsed clock signal 42C-18. While a clock pulse is not being provided by the third pulsed clock signal 42C-18, the third output bit state of the third output bit signal is held and thus not affected by the input bit state.

Each of the TMRMVLs in the TMRMBMVPCL of the SSC of the pipeline stage 18 further includes a majority gate, as explained in further detail below. The majority gate is configured to generate a resultant output bit signal having a resultant output bit state set in accordance with a majority bit state of the first output bit state of the first output bit signal from the first one of the redundant latches, the second output bit state of the second output bit signal from the second one of the redundant latches, and the third output bit state of the third output bit signal from the third one of the redundant latches. The resultant output bit signal is provided as one of the output bit signals of the data output 32. By providing majority voting, the TMRMVL protects a radiation strike at one of the three redundant latches from resulting in a soft error in the resultant output bit signal.

Furthermore, since the first pulsed clock signal 42A-18, the second pulsed clock signal 42B-18, and the third pulsed clock signal 42C-18 are delayed with respect to one another, a soft error in the input bit signal does not result in a soft error in the resultant bit state, so long as the soft error is not longer than the delay between the first pulsed clock signal 42A-18 and the second pulsed clock signal 42B-18, and between the second pulsed clock signal 42B-18 and the third pulsed clock signal 42C-18. In other words, by setting the delay duration between the first pulsed clock signal 42A-18 and the second pulsed clock signal 42B-18, and the delay duration between the second pulsed clock signal 42B-18 and the third pulsed clock signal 42C-18 so as to (with a very high probability) each be longer than a soft error in the input bit signal, then no more than one of the three redundant latches samples the soft error in the input bit signal. Furthermore, the RHDCGC of the pipeline stage 18 protects a soft error in the global clock signal 20 from causing more than two of the pulsed clock signals 42A-18, 42B-18, 42C-18 from having a soft error. This protects more than one of the three redundant pulsed clock latches in each of the TMRMVLs in the TMRMBMVPCL of the SSC of the pipeline stage 18 from sampling the input bit state of the input bit signal inappropriately, and thus protects a soft error in the resultant output bit state of the resultant output bit signal.

Figure 1B:
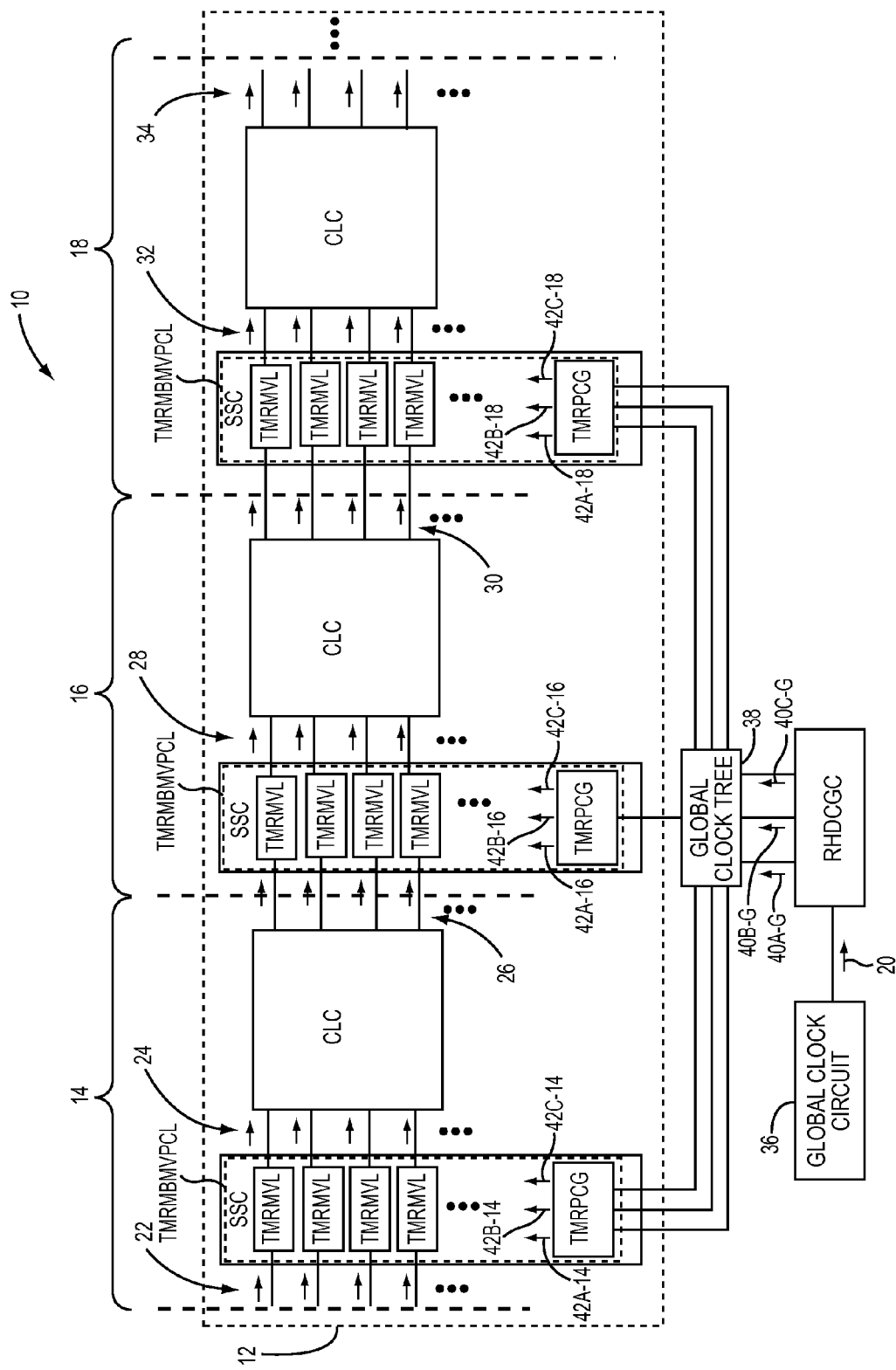
FIG. 1B illustrates an embodiment of a radiation hardened state machine with radiation hardened delayed clock generation circuitry coupled to a global clock tree.

FIG. 1B illustrates another embodiment of the RHSM 10. The RHSM 10 shown in FIG. 1B is the same as the RHSM 10 shown in FIG. 1A; except that the SSCs in the different pipeline stages 14, 16, 18 of the RHSM 10 shown in FIG. 1B do not include an RHDCGC. Instead, the RHSM 10 shown in FIG. 1B has an RHDCGC coupled to the global clock circuit 36 so as to receive the global clock signal 20, and the RHDCGC is coupled to the global clock tree 38. The global clock tree 38 shown in FIG. 1B is configured to distribute a first clock input signal 40A-G, a second clock input signal 40B-G, and a third clock input signal 40C-G provided by the RHDCGC to the SSCs in each of the different pipeline stages 14, 16, 18.

The RHDCGC in FIG. 1B is coupled to the global clock circuit 36 so as to receive the global clock signal 20. The RHDCGC is configured to provide the first clock input signal 40A-G, the second clock input signal 40B-G that is delayed with respect to the first clock input signal 40A-G, and the third clock input signal 40C-G that is delayed with respect to the second clock input signal 40B-G and has an even greater delay with respect to the first clock input signal 40A-G. For example, the second clock input signal 40B-G is delayed with respect to the first clock input signal 40A-G by delay duration, and the third clock input signal 40C-G is delayed with respect to the second clock input signal 40B-G by approximately the same delay duration. Accordingly, the third clock input signal 40C-G is delayed with respect to the first clock input signal 40A-G by approximately double the delay duration.

The RHDCGC is configured to protect a radiation strike from resulting in a soft error in at least two of the clock input signals 40A-G, 40B-G, 40C-G. In one exemplary embodiment, the RHDCGC is configured to generate the first clock input signal 40A-G, the second clock input signal 40B-G, and the third clock input signal 40C-G from the global clock signal 20. Each of the clock input signals 40A-G, 40B-G, 40C-G provides the temporal series of clock pulses in a standard temporal clock format. Thus, each of the clock input signals 40A-G, 40B-G, 40C-G has the substantially the same time period of oscillation as the global clock signal 20, which defines a temporal duration of each clock cycle of each of the clock input signals 40A-G, 40B-G, 40C-G.

Furthermore, during each clock cycle of each of the clock input signals 40A-G, 40B-G, 40C-G, each of the clock input signals 40A-G, 40B-G, 40C-G provides a clock pulse for approximately 50% of the temporal duration of each clock cycle, and thus each of the clock input signals 40A-G, 40B-G, 40C-G is in the first clock state for approximately 50% of the temporal duration of each clock cycle and in the second clock state for approximately 50% of the temporal duration of each clock cycle. Thus, each of the clock input signals 40A-G, 40B-G, 40C-G has a 50% duty cycle. However, the clock cycles, and thus the clock pulses, of the second clock input signal 40B-G are delayed with respect to the clock cycles, and thus the clock pulses, of the first clock input signal 40A-G. Additionally, the clock cycles, and thus the clock pulses, of the third clock input signal 40C-G are delayed with respect to the clock cycles, and thus the clock pulses, of the second clock input signal 40B-G. Accordingly, the clock cycles, and thus the clock pulses, of the third clock input signal 40C-G have an even greater delay with respect to the clock cycles, and thus the clock pulses, of the first clock input signal 40A-G. It should be noted that in this exemplary embodiment, the first clock input signal 40A-G may be delayed with respect to the global clock signal 20. Also, in the exemplary embodiment, the RHDCGC is configured to protect a radiation strike from resulting in a soft error in the first clock input signal 40A-G, in the second clock input signal 40B-G, and in the third clock input signal 40C-G. The RHDCGC is thus a radiation hardened digital circuit.

In an alternative exemplary embodiment, the RHDCGC is configured to pass the global clock signal 20 as the first clock input signal 40A-G and generate the first clock input signal 40A-G, the second clock input signal 40B-G, and the third clock input signal 40C-G from the global clock signal 20. The first clock input signal 40A-G, the second clock input signal 40B-G, and the third clock input signal 40C-G are delayed in the same manner described above for the other exemplary embodiment described above. However, since the first clock input signal 40A-G is provided as the global clock signal 20, the first clock input signal 40A-G is not delayed with respect to the global clock signal 20. Furthermore, since the RHDCGC simply passes the global clock signal 20 as the first clock input signal 40A-G, the RHDCGC is only configured to protect a radiation strike from resulting in a soft error in the second clock input signal 40B-G and in the third clock input signal 40C-G but not in the first clock input signal 40A-G. The RHDCGC is thus a radiation hardened digital circuit.

In the embodiment shown in FIG. 1B, the TMRMBM-VPCLs of the SSCs in the different pipeline stages 14, 16, 18 are the same as the TMRMBMVPCLs shown in FIG. 1A, except that each of the TMRPCLs in the TMRMBMVPCLs in the different pipeline stages 14, 16, 18 shown in FIG. 1B is coupled to the global clock tree 38. Thus, each of the TMRPCLs is configured to receive the first clock input signal 40A-G, the second clock input signal 40B-G, and the third clock input signal 40C-G from the global clock tree 38. Each of the TMRPCLs shown in FIG. 1B operates in the same manner with respect to the clock input signals 40A-G, 40B-G, and 40C-G as the TMRPCLs shown in FIG. 1A operated with respect to the clock input signals 40A-14, 40B-14, and 40C-14, the clock input signals 40A-16, 40B-16, and 40C-16, and the clock input signals 40A-18, 40B-18, and 40C-18, respectively. Thus, each of the TMRPCLs shown in FIG. 1B samples input bit signals and generates resultant output bit signals as described above with respect to FIG. 1A.

It should be noted that for the sake of simplicity and clarity, clock input signals 40A-14, 40A-16, 40A-18 and 40A-G will be referred to generically as elements 40A, clock input signals 40B-14, 40B-16, 40B-18 and 40B-G will be referred to generically as elements 40B, and clock input signals 40C-14, 40C-16, 40C-18 and 40C-G in FIG. 1A and FIG. 1B will be referred to generically as elements 40C for the remainder of this disclosure. Furthermore, pulsed clock signals 42A-14, 42A-16, 42A-18 and 42A-G will be referred to generically as elements 42A, pulsed clock signals 42B-14, 42B-16, 42A-18 and 42B-G will be referred to generically as elements 42B, and pulsed clock signals 42C-14, 42C-16, 42C-18 and 42C-G in FIG. 1A and FIG. 1B will be referred to generically as elements 42C. Note that in FIG. 1A, the RHDCGCs are each provided locally at the SSCs and thus timing synchronization is easier. However, in FIG. 1B, the RHDCGC provides the clock input signals 40A-G, 40B-G, and 40B-G through the global clock tree 38. Thus, since only one RHDCGC is provided, less power may be consumed.

Figure 2:
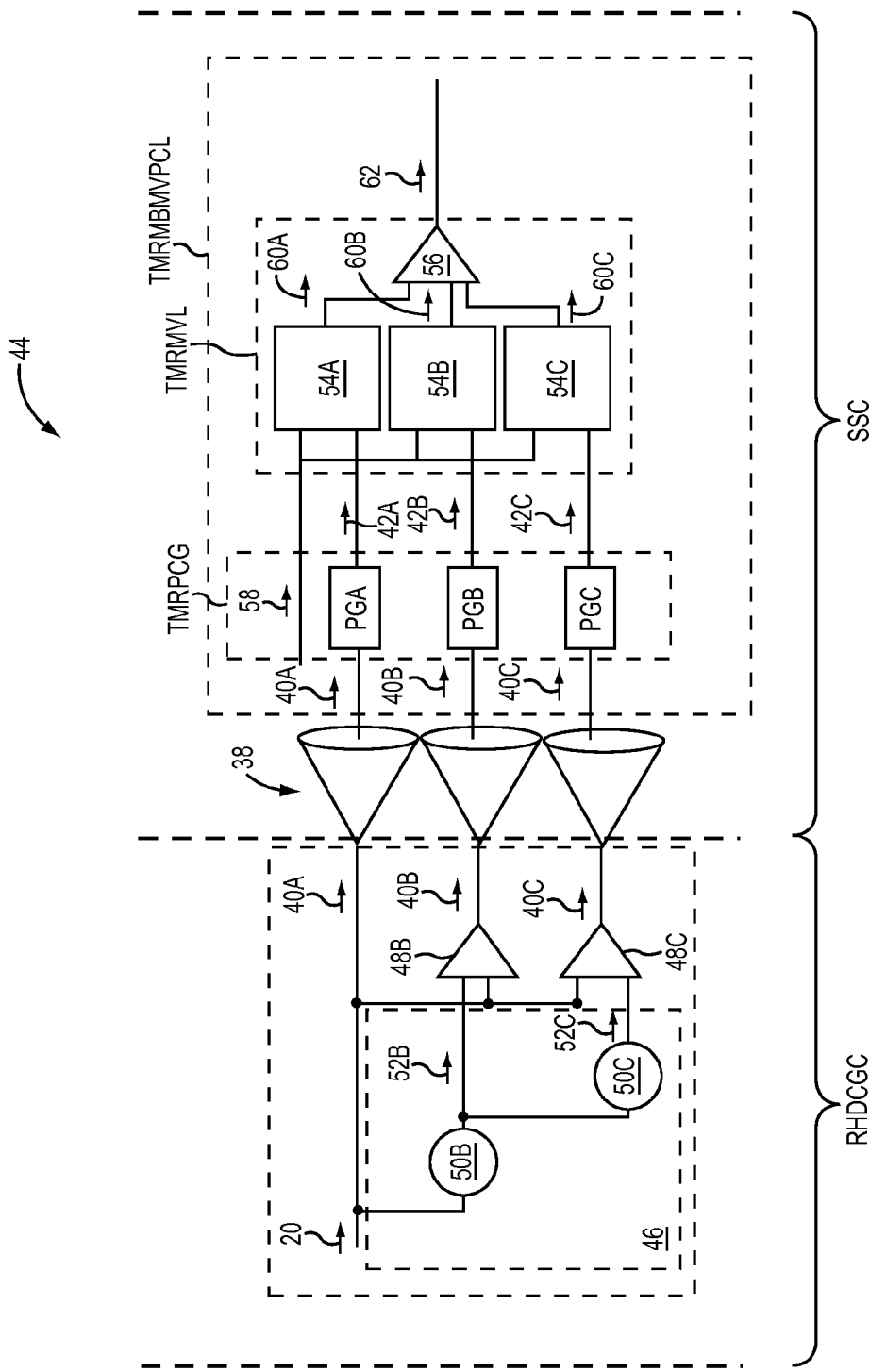
FIG. 2 illustrates one embodiment of a radiation hardened digital circuit in accordance with the embodiment in FIG. 1B.

FIG. 2 illustrates an exemplary radiation hardened digital circuit 44 in accordance to one embodiment of the design shown in FIG. 1B. As such, the radiation hardened digital circuit 44 includes the RHDCGC coupled to the global clock tree 38 so as to provide the first clock input signal 40A, the second clock input signal 40B, and the third clock input signal 40C to the TMRPCG of the TMRMBMVPCL in the SSC. It should be noted that, for the sake of simplicity and clarity, the TMRMBMVPCL shown in FIG. 2 only shows an exemplary embodiment of one of the TMRMVL. However, as illustrated in FIG. 1B, since the TMRMBMVPCL is multi-bit, the TMRMBMVPCL actually has multiple TMRMVLs, which are not explicitly shown, and may all be provided in the same manner as the TMRMVL shown in FIG. 2. The TMRMBMVPCL includes a pulse clock generator PGA configured to generate the first pulsed clock signal 42A, a pulse clock generator PGB configured to generate the second pulsed clock signal 42B, and a pulse clock generator PGC configured to generate the third pulsed clock signal 42C. In this embodiment, each of the TMRM-VLs (only one of which is explicitly shown in FIG. 2) in the TMRMBMVPCL would receive the first pulsed clock signal 42A, the second pulsed clock signal 42B, and the third pulsed clock signal 42C.

Referring again to FIG. 2, the RHDCGC is configured to receive the global clock signal 20. With regard to the first clock input signal 40A, the RHDCGC is configured pass the global clock signal 20 as the first clock input signal 40A to the global clock tree 38. Thus, in this exemplary embodiment, the first pulsed clock signal 42A is not delayed with respect to the signal 20. The RHDCGC is configured to generate the second clock input signal 40B from the signal 20 and to generate the third clock input signal 40C from the signal 20. To generate the second clock input signal 40B from the signal 20 and to generate the third clock input signal 40C from the signal 20, the RHDCGC includes a delay network 46 configured to receive the global clock signal 20 and two Muller C-gates 48B, 48C. In this embodiment, the delay network 46 includes two delay elements 50B, 50C, which in this embodiment are identical to each other. The delay element 50B is configured to receive the global clock signal 20 and generate a delayed clock signal 52B from the global clock signal 20. As such, the delayed clock signal 52B is delayed with respect to the global clock signal 20 and the first clock input signal 40A. More specifically, the delay element 50B has a propagation delay and thus, the delayed clock signal 52B is generated by the delay element 50B delayed by the propagation delay from the global clock signal 20 and from the first clock input signal 40A. The delay element 50B is configured such that the propagation delay provided by the delay element 50B is statistically highly likely to be greater than a temporal length of a soft errors caused by radiation strikes.

The delay element 50C is coupled to receive the delayed clock signal 52B from the delay element 50B. The delay element 50B is configured to receive the delayed clock signal 52B and generate a delayed clock signal 52C from the delayed clock signal 52B. As such, the delayed clock signal 52C is delayed with respect to the delayed clock signal 52B and the second clock input signal 40B. More specifically, the delay element 50B has a propagation delay and thus, the delayed clock signal 52C is generated by the delay element 50B delayed by the propagation delay from the delayed clock signal 52B and from the second clock input signal 40B. The delay element 50B is configured such that the propagation delay provided by the delay element 50B is statistically highly likely to be greater than a temporal length of a soft errors caused by radiation strikes. In this embodiment, the delay elements 50B, 50C are identical and thus have identical propagation delays. Accordingly, the delayed clock signal 52B is delayed with respect to the global clock signal 20 and the first clock input signal 40A by twice the propagation delay.

Each of the delayed clock signals 52B, 52C provides a temporal series of clock pulses in a standard temporal clock format. Thus, each of the delayed clock signals 52B, 52C has the substantially the same time period of oscillation as the global clock signal 20, which defines a temporal duration of each clock cycle of each of the delayed clock signals 52B, 52C.

Furthermore, during each clock cycle of each of the delayed clock signals 52B, 52C, each of the delayed clock signals 52B, 52C provides a clock pulse for approximately 50% of the temporal duration of each clock cycle and thus each of the delayed clock signals 52B, 52C is in the first clock state for approximately 50% of the temporal duration of each clock cycle and in the second clock state for approximately 50% of the temporal duration of each clock cycle. Thus, each of the delayed clock signals 52B, 52C has a 50% duty cycle. However, the clock cycles, and thus the clock pulses, of the delayed clock signal 52B are delayed by the propagation delay of the delay element 50B with respect to the clock cycles, and thus the clock pulses, of the global clock signal 20 and the first clock input signal 40A. Furthermore, the clock cycles, and thus the clock pulses, of the delayed clock signal 52C are delayed by the propagation delay of the delay element 50C with respect to the clock cycles, and thus the clock pulses, of the delayed clock signal 52B. Finally, the delayed clock signal 52C is delayed by the aggregate of the propagation delay of the delay element 50B and the propagation delay of the delay element 50C with respect to the clock cycles, and thus the clock pulses, of the global clock signal 20 and the first clock input signal 40A.

The RHDCGC is configured to protect a radiation strike from resulting in a SET propagating in the second clock input signal 40B and in the third clock input signal 40C. More specifically, if a radiation strike results in a SET in the global clock signal 20, the RHDCGC is configured to protect propagation of the SET in the second clock input signal 40B and in the third clock input signal 40C. In this embodiment, the Muller C element 48B has an input terminal configured to receive the global clock signal 20 and another input terminal coupled to the delay element 50B so as to receive the delayed clock signal 52B. In this manner, the Muller C element 48B is configured to generate the second clock input signal 40B. More specifically, the Muller C element 48B is configured to set the second clock input signal 40B to one of the set of clock states (i.e., the first clock state or the second clock state) in response to the delayed clock signal 52B and the global clock signal 20 each being provided in a same one of the set of clock states (i.e., both being provided in the first clock state, or both being provided in the second clock state). For example, in this embodiment, the Muller C element 48B is a non-inverting Muller C element. As such, the Muller C element 48B is configured to set the second clock input signal 40B to the first clock state in response to the delayed clock signal 52B and the global clock signal 20 each being provided in the first clock state. Likewise, the Muller C element 48B is configured to set the second clock input signal 40B to the second clock state in response to the delayed clock signal 52B and the global clock signal 20 each being provided in the second clock state.

The Muller C element 48B is configured to hold the second clock input signal 40B in the one of the set of clock states in response to the delayed clock signal 52B and the global clock signal 20 being provided in different ones of the set of clock states. For example, in this embodiment, the Muller C element 48B is the non-inverting Muller C element. As such, the Muller C element 48B is configured to hold the second clock input signal 40B in the first clock state in response to one of either the delayed clock signal 52B and the global clock signal 20 being switched into the second clock state while the other one of the delayed clock signal 52B is maintained in the first clock state. Likewise, the Muller C element 48B is configured to hold the second clock input signal 40B in the second clock state in response to one of either the delayed clock signal 52B and the global clock signal 20 being switched in the first clock state while the other one of the delayed clock signal 52B is maintained in the second clock state. Thus, the second clock input signal 40B is generated at an output terminal of the Muller C element 48B in the same manner as the delayed clock signal 52B. Furthermore, the Muller C element 48B protects against a SET in either the global clock signal 20 or the delayed clock signal 52B caused by a radiation strike, since the Muller C element 48B will simply hold the second clock input signal 40B in the correct clock state. In other words, since the propagation delay is statistically highly likely to be longer than the SET duration in one of the global clock signal 20 or the delayed clock signal 52B, both the global clock signal 20 and the delayed clock signal 52B will not be provided at the same incorrect clock state at the same time at the input terminals of the Muller C element 48B. Therefore, the Muller C element 48B protects the second clock input signal 40B from a soft error if a radiation strike results in a soft error in the delayed clock signal 52B or if a radiation strike results in a soft error in the global clock signal 20.

With regard to the Muller C element 48C, the Muller C element 48C has an input terminal configured to receive the global clock signal 20 and another input terminal coupled to the delay element 50C so as to receive the delayed clock signal 52C. In this manner, the Muller C element 48C is configured to generate the third clock input signal 40C. More specifically, the Muller C element 48C is configured to set the third clock input signal 40C to one of the set of clock states (i.e., the first clock state or the second clock state) in response to the delayed clock signal 52C and the global clock signal 20 each being provided in a same one of the set of clock states (i.e., both being provided in the first clock state, or both being provided in the second clock state). For example, in this embodiment, the Muller C element 48C is a non-inverting Muller C element. As such, the Muller C element 48C is configured to set the third clock input signal 40C to the first clock state in response to the delayed clock signal 52C and the global clock signal 20 each being provided in the first clock state. Likewise, the Muller C element 48C is configured to set the third clock input signal 40C to the second clock state in response to the delayed clock signal 52C and the global clock signal 20 each being provided in the second clock state.

The Muller C element 48C is configured to hold the third clock input signal 40C in the one of the set of clock states in response to the delayed clock signal 52C and the global clock signal 20 being provided in different ones of the set of clock states. For example, in this embodiment, the Muller C element 48C is the non-inverting Muller C element. As such, the Muller C element 48C is configured to hold the third clock input signal 40C in the first clock state in response to one of either the delayed clock signal 52C or the global clock signal 20 being switched into the second clock state while the other one of the delayed clock signals 52C is maintained in the first clock state. Likewise, the Muller C element 48C is configured to hold the third clock input signal 40C in the second clock state in response to one of either the delayed clock signal 52C and the global clock signal 20 being switched in the first clock state while the other one of the delayed clock signals 52C is maintained in the second clock state. Thus, the third clock input signal 40C is generated at an output terminal of the Muller C element 48C in the same manner as the delayed clock signal 52C. Furthermore, the Muller C element 48C protects against a SET in either the global clock signal 20 or the delayed clock signal 52C caused by a radiation strike, since the Muller C element 48C simply holds the third clock input signal 40C in the correct clock state. In other words, since the second propagation delay is statistically highly likely to be longer than the SET in one of the global clock signal 20 or the delayed clock signal 52C, both the global clock signal 20 and the delayed clock signal 52C will not be provided at the same incorrect clock state at the same time at the input terminals of the Muller C element 48C. Therefore, the Muller C element 48C protects the third clock input signal 40C from a SET if a radiation strike results in a SET in the delayed clock signal 52C or if a radiation strike results in a soft error in the global clock signal 20. Note furthermore that the delayed clock signals 52B, 52C will not be provided in the incorrect clock state at the same time since each is delayed with respect to one another by the propagation delay of the delay element 50C.

In this embodiment, the pulse clock generator PGA is connected to the global clock tree 38 so as to receive the first clock input signal 40A (which in this example is the global clock signal 20) and generate the first pulsed clock signal 42A from the first clock input signal 40A. The output terminal of the Muller C element 48B is coupled to the global clock tree 38. The pulse clock generator PGB is coupled to the global clock tree 38 so as to receive the second clock input signal 40B and generate the second pulsed clock signal 42B from the second clock input signal 40B. The output terminal of the Muller C element 48B is also coupled to the global clock tree 38. The pulse clock generator PGC is coupled to the global clock tree 38 so as to receive the third input clock signal 40C and generate the third pulsed clock signal 42C from the third input clock signal 40C.

The TMRMVL includes three redundant latches 54A, 54B, 54C (referred to generically as elements 54) and a majority gate 56. Each of the redundant latches 54A, 54B, 54C is configured to receive an input bit signal 58 having an input bit state (either a bit state representing logic "1" or a bit state representing logic "0"). The first redundant latch 54A is coupled to the pulse clock generator PGA so as to receive the first pulsed clock signal 42A. For the remainder of this disclosure and for the sake of clarity, it will be presumed that a clock pulse is provided in a first clock state, which is a high clock state, and that a clock pulse is not being provided in a second clock state, which is a low clock state. The first redundant latch 54A is configured to generate a first output bit signal 60A having an first output bit state (either a bit state representing logic "1" or a bit state representing logic "0"). More specifically, the first redundant latch 54A is configured to sample the input bit state of the input bit signal 58 while the first pulsed clock signal 42A is in the first clock state (i.e. during a clock pulse) so that the first output bit state of the first output bit signal 60A is set in accordance with the input bit state. However, the first redundant latch 54A is configured to hold the first output bit state of the first output bit signal 60A while the first pulsed clock signal 42A is in the second clock state (when no clock pulse is being provided).

The second redundant latch 54B is configured to generate a second output bit signal 60B having a second output bit state (either a bit state representing logic "1" or a bit state representing logic "0"). More specifically, the second redundant latch 54B is configured to sample the input bit state of the input bit signal 58 while the second pulsed clock signal 42B is in the first clock state (i.e. during a clock pulse) so that the first output bit state of the second output bit signal 60B is set in accordance with the input bit state. However, the second redundant latch 54B is configured to hold the second output bit state of the second output bit signal 60B while the second pulsed clock signal 42B is in the second clock state (when no clock pulse is being provided).

The third redundant latch 54C is configured to generate a third output bit signal 60C having a third output bit state (either a bit state representing logic "1" or a bit state representing logic "0"). More specifically, the third redundant latch 54C is configured to sample the input bit state of the input bit signal 58 while the third pulsed clock signal 42C is in the first clock state (i.e. during a clock pulse) so that the first output bit state of the third output bit signal 60C is set in accordance with the input bit state. However, the third redundant latch 54C is configured to hold the third output bit state of the third output bit signal 60C while the third pulsed clock signal 42C is in the second clock state (when no clock pulse is being provided).

The majority gate 56 has an input terminal coupled to the first redundant latch 54A so as to receive the first output bit signal 60A, another input terminal coupled to the second redundant latch 54B so as to receive the second output bit signal 60B, and yet another input terminal coupled to the third redundant latch 54C so as to receive the third output bit signal 60C. The majority gate 56 is configured to generate a resultant output signal 62 having a resultant bit state set to a majority bit state of the first output bit state, the second output bit state, and the third output bit state. Note that the second pulsed clock signal 42B is delayed by the propagation delay of the delay element 50B with respect to the first pulsed clock signal 42A. Furthermore, the third pulsed clock signal 42C is delayed by the propagation delay of the delay element 50C with respect to the second pulsed clock signal 42B. Thus, sampling by the redundant latches 54 is temporally separated so that if there is a SET in the input bit state of the input bit signal 58 due to a radiation strike, no more than one of the redundant latches 54 would sample the input bit state during the soft error. Accordingly, the majority gate 56 would still provide the correct resultant bit state of the resultant bit signal appropriately through the majority vote correction provided by the majority gate 56.

Figure 3:
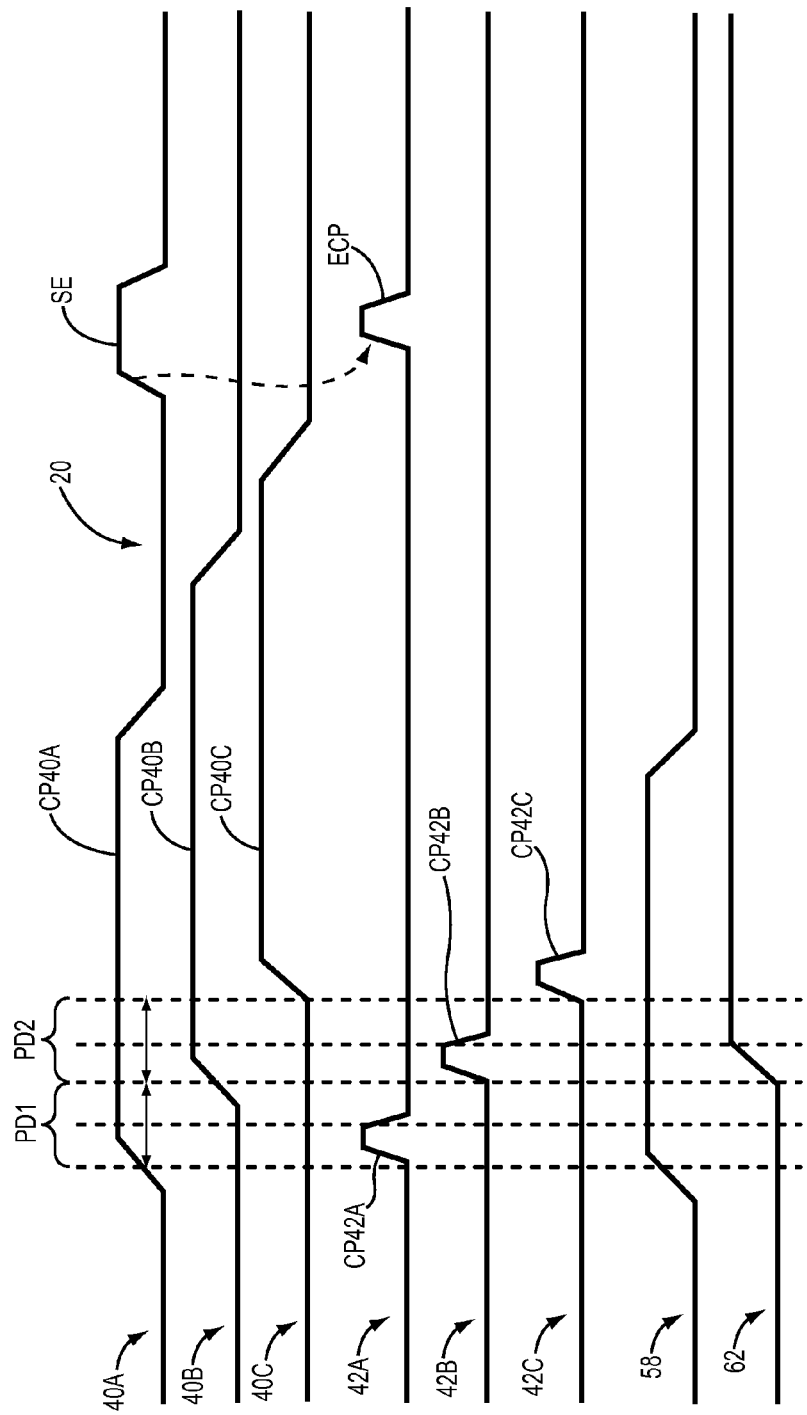
FIG. 3 illustrates an exemplary signal diagram for the radiation hardened digital circuit shown in FIG. 2.

FIG. 3 illustrates an exemplary signal diagram for the radiation hardened digital circuit 44 shown in FIG. 2. More specifically, FIG. 3 includes a signal diagram with the first clock input signal 40A, the second clock input signal 40B, the third clock input signal 40C, the first pulsed clock signal 42A, the second pulsed clock signal 42B, the third pulsed clock signal 42C, the input bit signal 58, and the resultant output signal 62. As explained above with respect to FIG. 2, the first pulsed clock signal 42A is provided as the signal 20. To begin, the first clock input signal 40A is shown to include a clock pulse CP40A when the first clock input signal 40A is in the first clock state (in this example, a high voltage state). The second clock input signal 40B is generated by the Muller C element 48B is delayed by the propagation delay PD1 of the delay element 50B with respect to the first clock input signal 40A, as explained above. Thus, the second clock input signal 40B has a clock pulse CP40B delayed by the propagation delay PD1. The third clock input signal 40C is generated by the Muller C element 48C and delayed by the propagation delay PD2 of the delay element 50C with respect to the second clock input signal 40B, as explained above. Thus, the third clock input signal 40C has a clock pulse CP40C delayed by the propagation delay PD2 from the clock pulse CP40B and delayed by an aggregate of the propagation delay PD1 and the propagation delay PD2 from the clock pulse CP40A.

As such, the pulsed clock generator PGA (shown in FIG. 2) generates the first pulsed clock signal 42A from the first clock input signal 40A with a clock pulse CP42A in response to the clock pulse CP40A of the first clock input signal 40A. Since the duty cycle of the first pulsed clock signal 42A is much shorter (less than 25%) than the duty cycle of the first clock input signal 40A, the clock pulse CP42A is much shorter than the clock pulse CP40A. The pulsed clock generator PGB (shown in FIG. 2) generates the second pulsed clock signal 42B from the second clock input signal 40B with a clock pulse CP42B in response to the clock pulse CP40B of the second clock input signal 40B. Since the duty cycle of the second pulsed clock signal 42B is much shorter (less than 25%) than the duty cycle of the second clock input signal 40B, the clock pulse CP42B is much shorter than the clock pulse CP40B. Furthermore, since the second clock input signal 40B is delayed with respect to the first clock input signal 40A by the propagation delay PD1, the clock pulse CP42B is delayed with respect to the clock pulse CP42A by the propagation delay PD1. The pulsed clock generator PGC (shown in FIG. 2) generates the third pulsed clock signal 42C from the third clock input signal 40C with a clock pulse CP42C in response to the clock pulse CP40C of the third clock input signal 40C. Since the duty cycle of the third pulsed clock signal 42C is much shorter (less than 25%) than the duty cycle of the third clock input signal 40C, the clock pulse CP42C is much shorter than the clock pulse CP40C. Furthermore, since the third clock input signal 40C is delayed with respect to the second clock input signal 40B by the propagation delay PD2, the clock pulse CP42C is delayed with respect to the clock pulse CP42B by the propagation delay PD2. Additionally, since the third clock input signal 40C is delayed with respect to the first clock input signal 40A by the aggregate of the propagation delay PD1 and the propagation delay PD2, the clock pulse CP42C is delayed with respect to the clock pulse CP42A by the aggregate of the propagation delay PD1 and the propagation delay PD2.

Accordingly, the first redundant latch 54A (shown in FIG. 2) samples the input bit state of the input bit signal 58 in response to the clock pulse CP42A. During the clock pulse CP42A of the first pulsed clock signal 42A, the input bit state of the input bit signal 58 is in a high voltage state. However, because of the majority voting provided by the majority gate 56, the resultant output bit state of the output bit resultant output signal 62 is not provided in the high voltage state until at least two of the redundant latches 54 sample the input bit state of the input bit signal 58 in the high voltage state. The second redundant latch 54B (shown in FIG. 2) samples the input bit state of the input bit signal 58 in response to the clock pulse CP42B. During the clock pulse CP42B of the second pulsed clock signal 42B, the input bit state of the input bit signal 58 is in the high voltage state. The resultant output bit state of the output bit resultant output signal 62 is now provided in the high voltage state since the redundant latches 54A, 54B have sampled the input bit state of the input bit signal 58 in the high voltage state. The third redundant latch 54C (shown in FIG. 2) samples the input bit state of the input bit signal 58 in response to the clock pulse CP42C. During the clock pulse CP42C of the third pulsed clock signal 42C, the input bit state of the input bit signal 58 is in the high voltage state.

FIG. 3 illustrates a SET SE that is provided in the global clock signal 20 and the first clock input signal 40A due to a radiation strike. As a result, the first pulsed clock signal 42A includes an erroneous clock pulse ECP as a result of the soft error SE. Thus, the first redundant latch 54A (shown in FIG. 2) samples the input bit state of the input bit signal 58 inappropriately. However, the Muller C elements 48B, 48C (shown in FIG. 2) prevent the second clock input signal 40B and the third clock input signal 40C, respectively, from having a SET due to the SET SE in the global clock signal 20 and the first clock input signal 40A. Therefore, the second pulsed clock signal 42B and the third pulsed clock signal 42C do not include erroneous clock pulses, and thus the redundant latches 54B, 54C do not erroneously sample the input bit state of the input bit signal 58. Therefore, due to majority voting of the majority gate 56 (shown in FIG. 2), the resultant output bit state of the resultant output bit resultant output signal 62 is maintained appropriately despite the soft error SE provided in the global clock signal 20 and the first clock input signal 40A due to the radiation strike.

Figure 4:
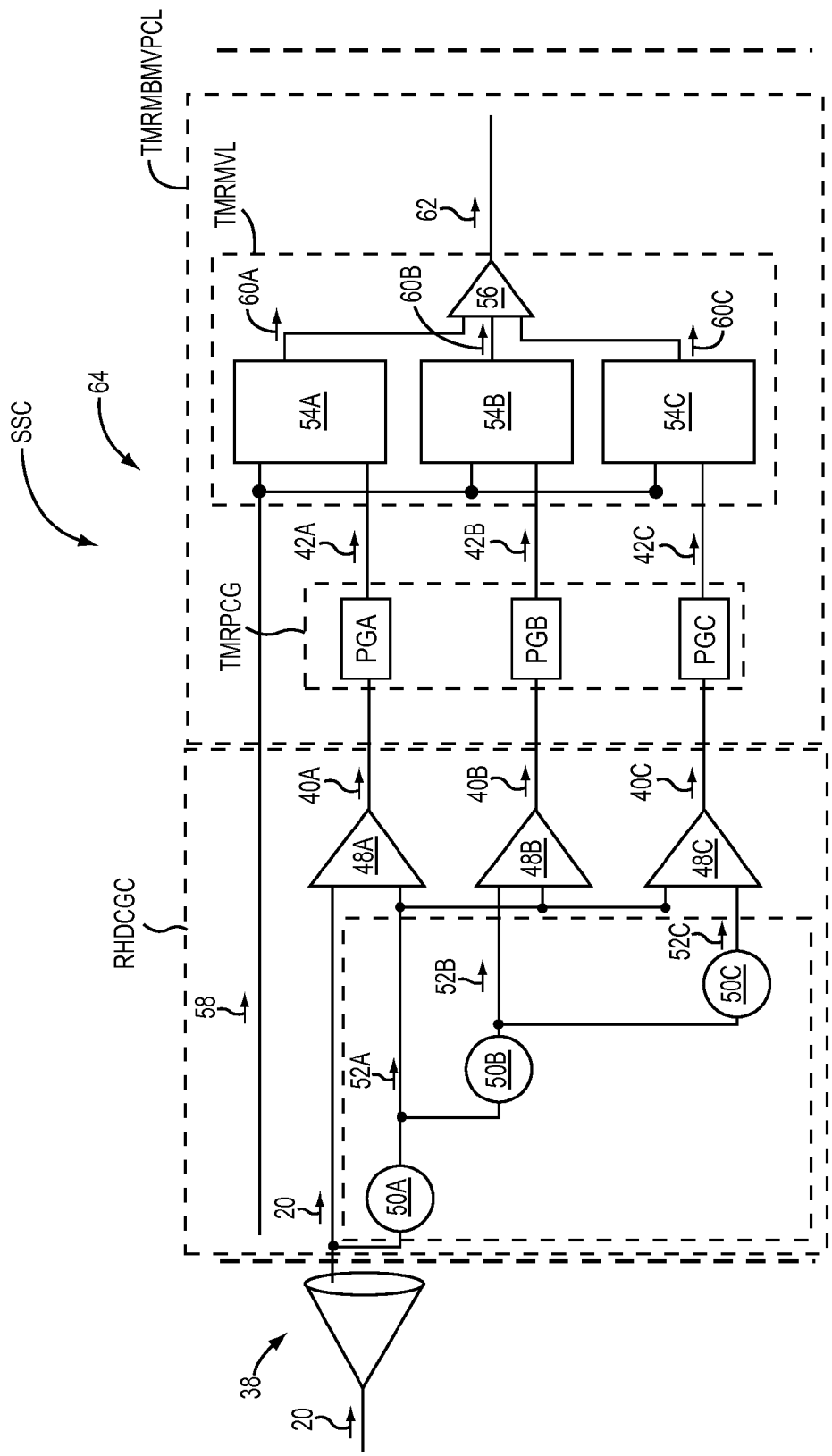
FIG. 4 illustrates an exemplary radiation hardened digital circuit in accordance to one embodiment of the design shown in FIG. 1A.

FIG. 4 illustrates an exemplary radiation hardened digital circuit 64 in accordance to one embodiment of the design shown in FIG. 1A. As such, the radiation hardened digital circuit 64 includes the RHDCGC coupled to the global clock tree 38 so as to receive the global clock signal 20. In this example, the RHDCGC is provided locally in the SSC, as described above with respect to FIG. 1A. The RHDCGC is configured to provide the first clock input signal 40A, the second clock input signal 40B, and the third clock input signal 40C to the TMRPCG of the TMRMBMVPCL in the SSC. It should be noted that, for the sake of simplicity and clarity, the TMRMBMVPCL only shows an exemplary embodiment of one of the TMRMVLs, which is the same as the TMRMVL shown in FIG. 2. However, as illustrated in FIG. 1A, since the TMRMBMVPCL is multi-bit, the TMRMBMVPCL actually has multiple TMRMVLs, which are not explicitly shown, and may all be provided in the same manner as the TMRMVL shown in FIG. 2 and FIG. 4. The TMRPCL includes the pulse clock generator PGA configured to generate the first pulsed clock signal 42A, the pulse clock generator PGB configured to generate the second pulsed clock signal 42B, and the pulse clock generator PGC configured to generate the third pulsed clock signal 42C, as described above with respect to FIG. 2. In this embodiment, each of the TMRMVLs (only one which is explicitly shown in FIG. 4) in the TMRMBMVPCL would receive the first pulsed clock signal 42A, the second pulsed clock signal 42B, and the third pulsed clock signal 42C.

Referring again to FIG. 4, the RHDCGC is configured to receive the global clock signal 20. In this embodiment, the RHDCGC includes a Muller C element 48A, and the delay network 46 includes a delay element 50A. The delay element 50A is identical to the delay elements 50B, 50C. The delay element 50A is configured to receive the global clock signal 20 and generate a first redundant latch 52A from the global clock signal 20. As such, the first redundant latch 52A is delayed with respect to the global clock signal 20. More specifically, the delay element 50A has a propagation delay and thus, the first redundant latch 52A is generated by the delay element 50A delayed by the propagation delay from the global clock signal 20.

The delay element 50B is coupled to receive the first redundant latch 52A from the delay element 50A and generate a delayed clock signal 52B from the first redundant latch 52A. As such, the delayed clock signal 52B is delayed with respect to the first redundant latch 52A and the first clock input signal 40A. More specifically, the delay element 50A has a propagation delay and thus, the delayed clock signal 52B is generated by the delay element 50A delayed by the propagation delay from the first redundant latch 52A and from the first clock input signal 40A. The delay element 50A is configured such that the propagation delay provided by the delay element 50A is statistically highly likely to be greater than a temporal length of a soft errors caused by radiation strikes. In this embodiment, the delay elements 50A, 50B are identical and thus have identical propagation delays. Accordingly, the delayed clock signal 52B is delayed with respect to the global clock signal 20 by twice the propagation delay.

The delay element 50C is coupled to receive the delayed clock signal 52B from the delay element 50B. The delay element 50B is configured to receive the delayed clock signal 52B and generate a delayed clock signal 52C from the delayed clock signal 52B. As such, the delayed clock signal 52C is delayed with respect to the delayed clock signal 52B and the second clock input signal 40B. More specifically, the delay element 50B has a propagation delay and thus, the delayed clock signal 52C is generated by the delay element 50B delayed by the propagation delay from the delayed clock signal 52B and from the second clock input signal 40B. The delay element 50B is configured such that the propagation delay provided by the delay element 50B is statistically highly likely to be greater than a temporal length of a soft errors caused by radiation strikes. In this embodiment, the delay elements 50A, 50B, 50C are identical and thus have nominally identical propagation delays. Accordingly, the delayed clock signal 52B is delayed with respect to the global clock signal 20 by three times the propagation delay, with respect to the first clock input signal 40A by twice the propagation delay, and the first clock input signal 40A by the propagation delay.

The RHDCGC is configured to protect a radiation strike from resulting in a SET in the first clock input signal 40A, in the second clock input signal 40B, and in the third clock input signal 40C. More specifically, if a radiation strike results in a soft error in the global clock signal 20, the RHDCGC is configured to protect a soft error, in the first clock input signal 40A, in the second clock input signal 40B, and in the third clock input signal 40C. In this embodiment, the Muller C element 48A has an input terminal configured to receive the global clock signal 20 and another input terminal coupled to the delay element 50A so as to receive the first redundant latch 52A. In this manner, the Muller C element 48A is configured to generate the first clock input signal 40A. More specifically, the Muller C element 48A is configured to set the first clock input signal 40A to one of the set of clock states (i.e., the first clock state or the second clock state) in response to the first redundant latch 52A and the global clock signal 20 each being provided in a same one of the set of clock states (i.e., both being provided in the first clock state, or both being provided in the second clock state). For example, in this embodiment, the Muller C element 48A is a non-inverting Muller C element. As such, the Muller C element 48A is configured to set the first clock input signal 40A to the first clock state in response to the first redundant latch 52A and the global clock signal 20 each being provided in the first clock state. Likewise, the Muller C element 48A is configured to set the first clock input signal 40A to the second clock state in response to the first redundant latch 52A and the global clock signal 20 each being provided in the second clock state. The Muller C elements 48B, 48C generate the second clock input signal 40B and the third clock input signal 40C in the same manner described above with respect to FIG. 3. However, in this embodiment, since the first clock input signal 40A is delayed by the propagation delay of the delay element 50A, the Muller C element 48B generates the second clock input signal 40B is delayed by the aggregate of the propagation delay of the delay element 50A and the propagation delay of the delay element 50B with respect to the global clock signal 20 and the Muller C element 48C generates the third clock input signal 40C is delayed by the aggregate of the propagation delay of the delay element 50A, the propagation delay of the delay element 50B, and the propagation delay of the delay element 50C with respect to the global clock signal 20.

In this embodiment, the RHDCGC is provided within the SSC. Thus, an output terminal of the Muller C element 48A is connected to the pulsed clock generator PGA, the output terminal of the Muller C element 48B is connected to the pulsed clock generator PGB, and the output terminal of the Muller C element 48C is connected to the pulsed clock generator PGC. The pulsed clock generators PGA, PGB, PGC generate the first clock input signal 40A, the second clock input signal 40B, and the third clock input signal 40C in the same manner described above with respect to FIG. 2. However, because of the delay element 50A, the pulsed clock generator PGA generates the first pulsed clock signal 42A, which is delayed by the propagation delay of the delay element 50A with respect to the global clock signal 20; the pulsed clock generator PGB generates the second pulsed clock signal 42B, which is delayed by the aggregate of the propagation delay of the delay element 50A and the propagation delay of the delay element 50B with respect to the global clock signal 20; and the pulsed generator PGC generates third pulsed clock signal 42C, which is delayed by the aggregate of the propagation delay of the delay element 50A, the propagation delay of the delay element 50B, and the propagation delay of the delay element 50C with respect to the global clock signal 20.

Figure 5A:
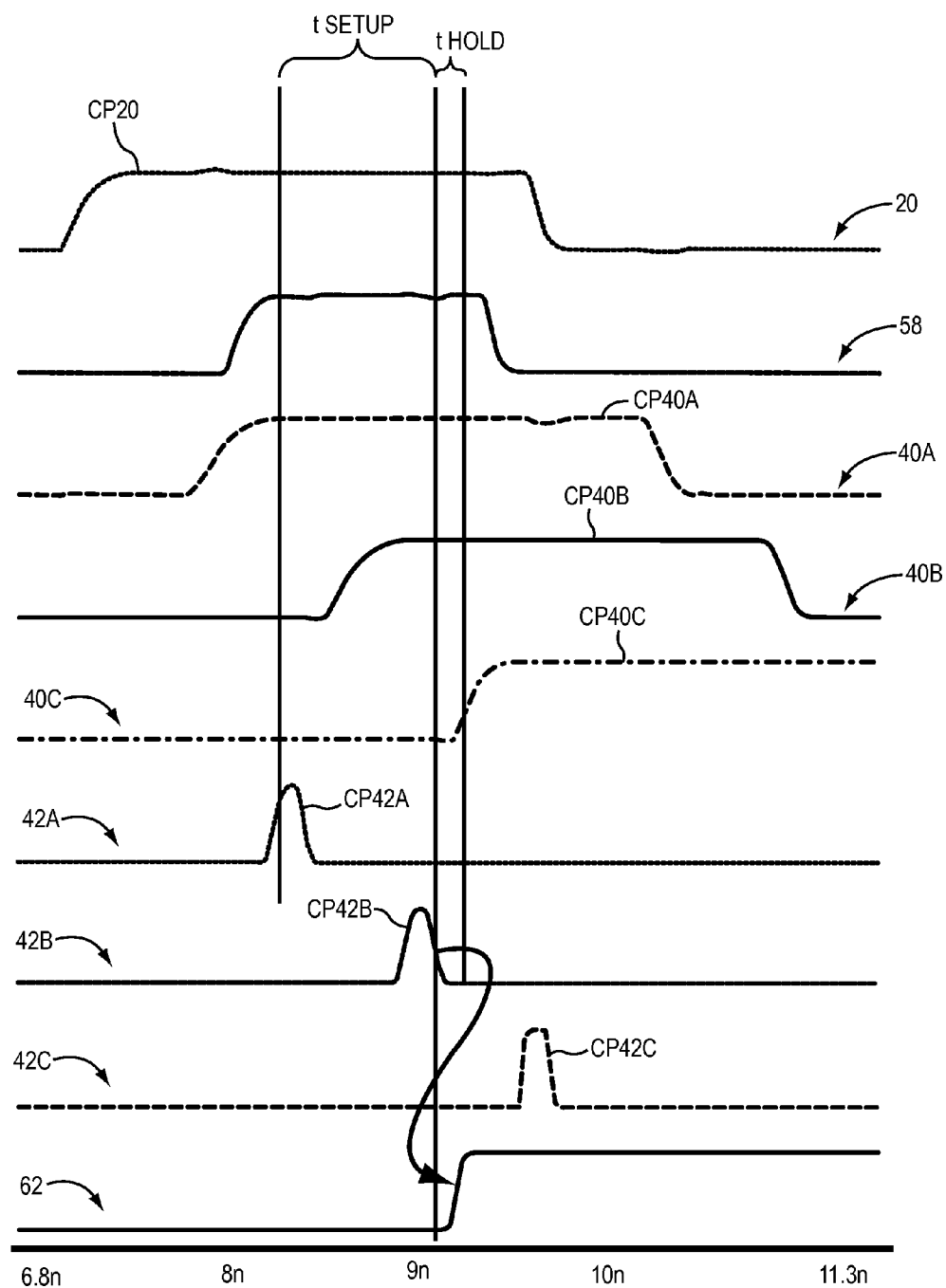
FIG. 5A illustrates an exemplary signal diagram for the radiation hardened digital circuit shown in FIG. 4 with no soft errors and during normal operation.

FIG. 5A illustrates an exemplary signal diagram for the radiation hardened digital circuit 64 shown in FIG. 4 with no soft errors and during normal operation. More specifically, FIG. 5A includes a signal diagram with the signal 20, the first clock input signal 40A, the second clock input signal 40B, the third clock input signal 40C, the first pulsed clock signal 42A, the second pulsed clock signal 42B, the third pulsed clock signal 42C, the input bit signal 58, and the resultant output signal 62. To begin, the first clock input signal 40A is shown to include the clock pulse CP40A when the first clock input signal 40A is in the first clock state (in this example, a high voltage state). The first clock input signal 40A is generated by the Muller C element 48A delayed by the propagation delay of the delay element 50B with respect to the signal 20, as explained above. The second clock input signal 40B is generated by the Muller C element 48B delayed by the propagation delay of the delay element 50B with respect to the first clock input signal 40A, as explained above. Thus, the second clock input signal 40B has the clock pulse CP40B delayed by the propagation delay. The third clock input signal 40C is generated by the Muller C element 48C delayed by the propagation delay of the delay element 50C with respect to the second clock input signal 40B, as explained above.

As such, the pulsed clock generator PGA (shown in FIG. 4) generates the first pulsed clock signal 42A from the first clock input signal 40A with a clock pulse CP42A in response to the clock pulse CP40A of the first clock input signal 40A. Since the duty cycle of the first pulsed clock signal 42A is much shorter (less than 25%) than that of the duty cycle of the first clock input signal 40A, the clock pulse CP42A is much shorter than the clock pulse CP40A. The pulsed clock generator PGB (shown in FIG. 4) generates the second pulsed clock signal 42B from the second clock input signal 40B with a clock pulse CP42B in response to the clock pulse CP40B of the second clock input signal 40B. Since the duty cycle of the second pulsed clock signal 42B is much shorter (less than 25%) that that of the duty cycle of the second clock input signal 40B, the clock pulse CP42B is much shorter than the clock pulse CP40B. Furthermore, since the second clock input signal 40B is delayed with respect to the first clock input signal 40A by the propagation delay, the clock pulse CP42B is delayed with respect to the clock pulse CP42A by the propagation delay. The pulsed clock generator PGC (shown in FIG. 4) generates the third pulsed clock signal 42C from the third clock input signal 40C with a clock pulse CP42C in response to the clock pulse CP40C of the third clock input signal 40C. Since the duty cycle of the third pulsed clock signal 42C is much shorter (less than 25%) than that of the duty cycle of the third clock input signal 40C, the clock pulse CP42C is much shorter than the clock pulse CP40C. Furthermore, since the third clock input signal 40C is delayed with respect to the second clock input signal 40B by the propagation delay, the clock pulse CP42C is delayed with respect to the clock pulse CP42B by the propagation delay.

Accordingly, the first redundant latch 54A (shown in FIG. 4) samples the input bit state of the input bit signal 58 in response to the clock pulse CP42A. During the clock pulse CP42A of the first pulsed clock signal 42A, the input bit state of the input bit signal 58 is in a high voltage state. However, because of the majority voting provided by the majority gate 56 (shown in FIG. 4), the resultant output bit state of the output bit resultant output signal 62 is not provided in the high voltage state until at least two of the redundant latches 54 sample the input bit state of the input bit signal 58 in the high voltage state. The second redundant latch 54B (shown in FIG. 4) samples the input bit state of the input bit signal 58 in response to the clock pulse CP42B. During the clock pulse CP42B of the second pulsed clock signal 42B, the input bit state of the input bit signal 58 is in the high voltage state. The resultant output bit state of the output bit resultant output signal 62 is now provided in the high voltage state since the redundant latches 54A, 54B have sampled the input bit state of the input bit signal 58 in the high voltage state. The third redundant latch 54C (shown in FIG. 4) samples the input bit state of the input bit signal 58 in response to the clock pulse CP42C. During the clock pulse CP42C of the third pulsed clock signal 42C, the input bit state of the input bit signal 58 is in the high voltage state.

The setup time requirement tSETUP and the hold time requirement tHOLD are shown in FIG. 5A. Since the resultant output signal 62 shown in FIG. 4A is majority voted, and the first output bit signal 60A (shown in FIG. 4), the second output bit signal 60B (shown in FIG. 4), and the third output bit signal 60C (shown in FIG. 4) to the majority gate 56 (shown in FIG. 4) are skewed in time by the amount of triple-mode redundant pulse-clock skew, the clock signal timing occurs after the second redundant latch 54B receives correct data. This may create a hold timing issue for back to back TMRMVLs. However, this can be dealt with through appropriate hold buffer insertion. Appropriate buffer insertion is a standard problem resolved using automated place and route tools, and does not present a serious issue.

Figure 5B:
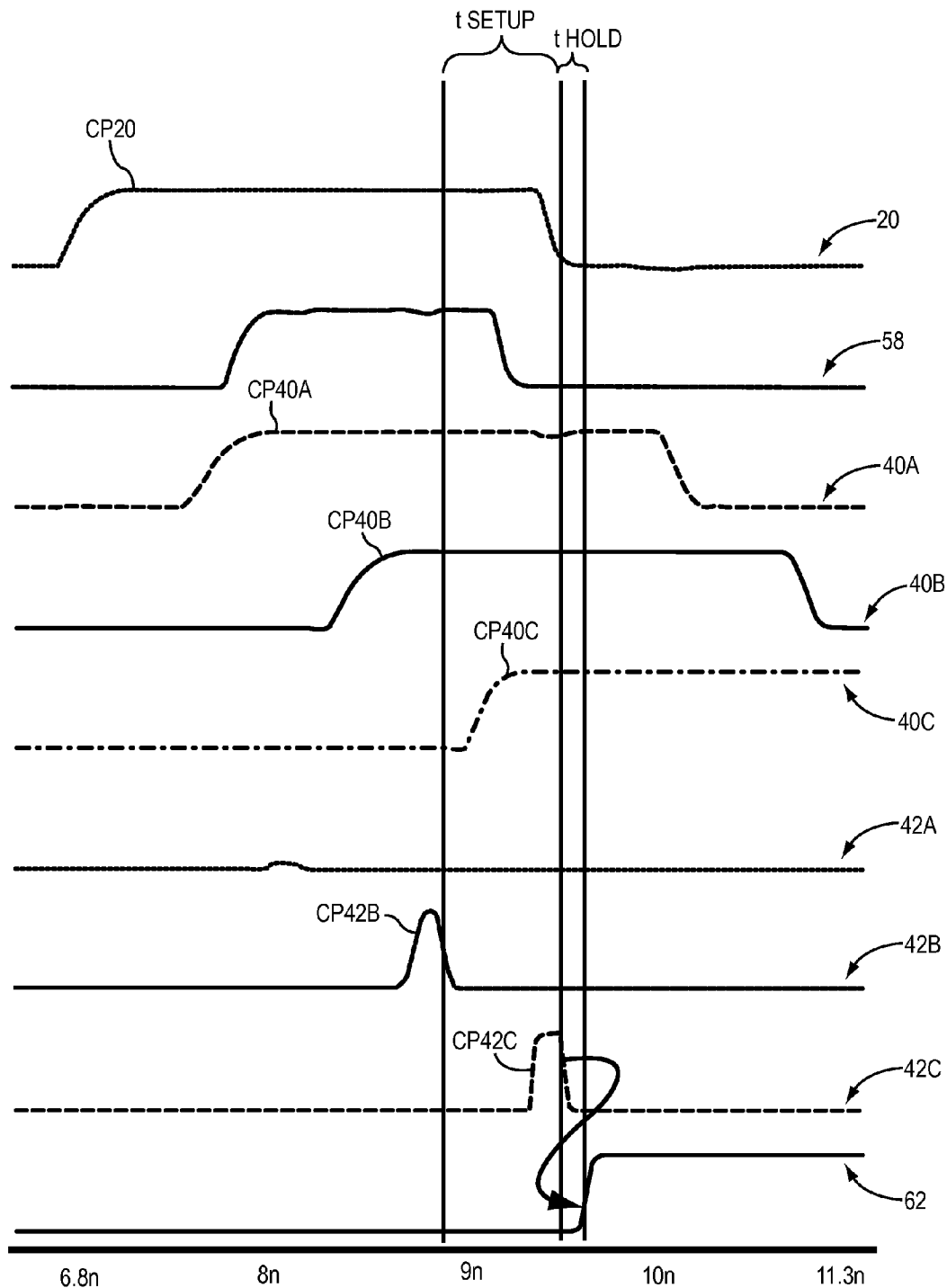
FIG. 5B illustrates an exemplary signal diagram for the radiation hardened digital circuit shown in FIG. 4 where a soft error is caused by a radiation strike on the first pulsed clock signal.

FIG. 5B illustrates an exemplary signal diagram for the radiation hardened digital circuit 64 shown in FIG. 4 where a SET is caused by a radiation strike on the first pulsed clock signal 42A. Thus, the first pulsed clock signal 42A does not include the clock pulse CP42A (shown in FIG. 5A). The resultant output signal 62 is not provided in the correct resultant bit state until the clock pulse CP42C. However, the correct resultant bit state is provided due to the majority voting.

Figure 5C:
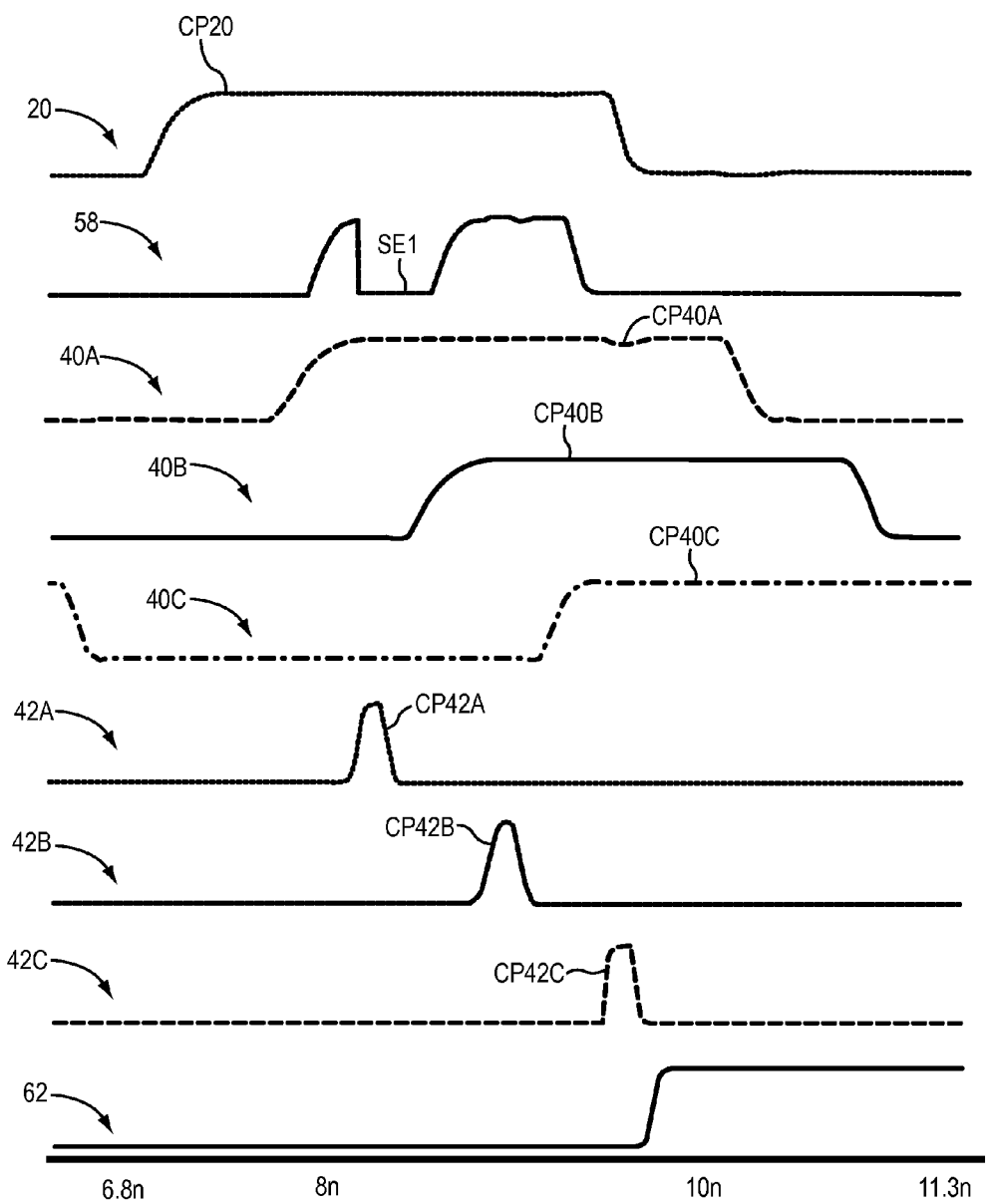
FIG. 5C illustrates an exemplary signal diagram for the radiation hardened digital circuit shown in FIG. 4 where a soft error is caused by a radiation strike on the input bit signal.

FIG. 5C illustrates an exemplary signal diagram for the radiation hardened digital circuit 64 shown in FIG. 4 where a SET SE1 is caused by a radiation strike on the input bit signal 58. Thus, the input bit state of the input bit signal 58 is inappropriately low during the SET SE1. The resultant output signal 62 is not provided in the correct resultant bit state until the clock pulse CP42C. However, the correct resultant bit state is provided due to the majority voting.

Figure 5D:
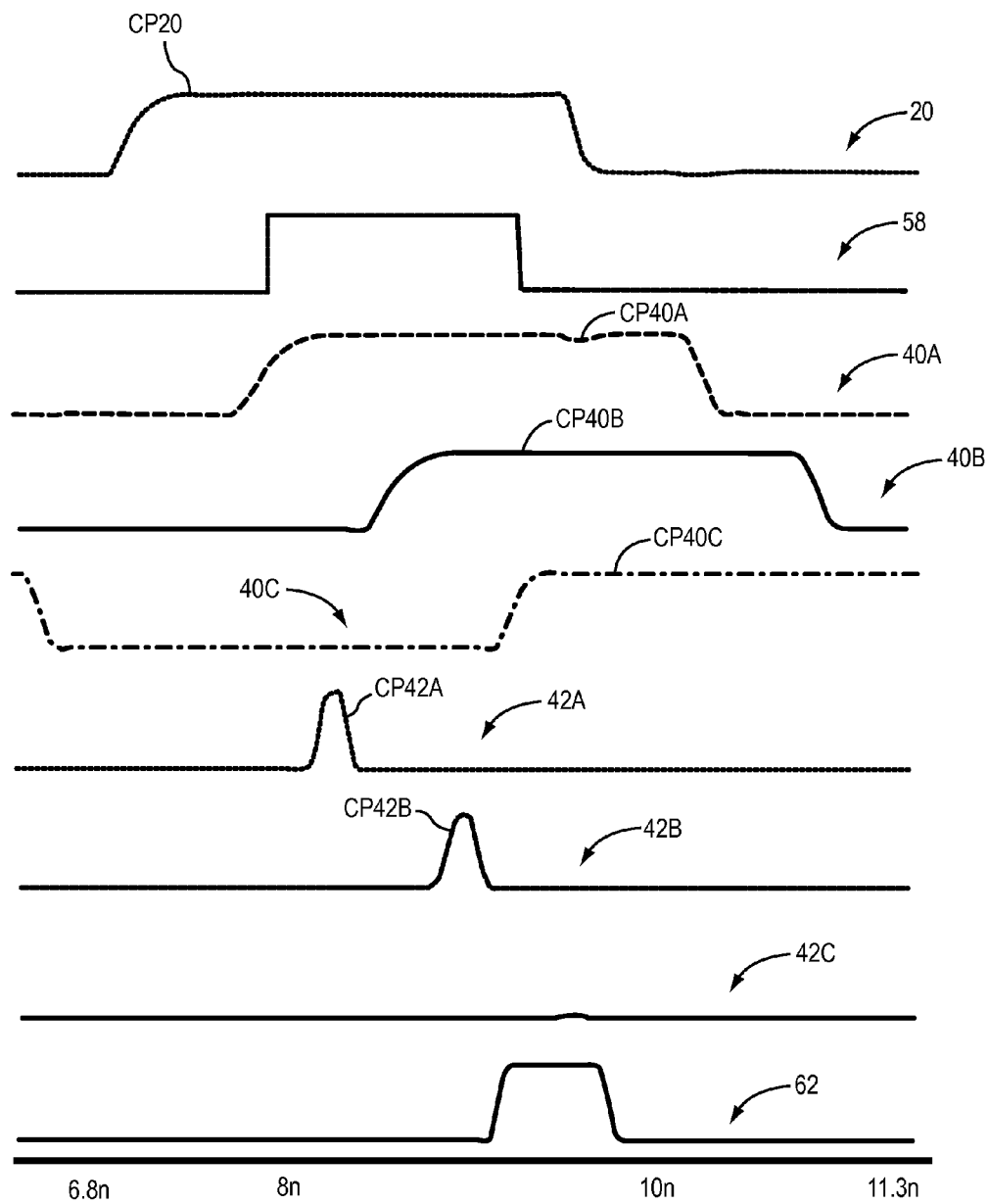
FIG. 5D illustrates an exemplary signal diagram for the radiation hardened digital circuit shown in FIG. 4 where a soft error is caused by a radiation strike on the third pulsed clock signal.

FIG. 5D illustrates an exemplary signal diagram for the radiation hardened digital circuit 64 shown in FIG. 4 where a soft error is caused by a radiation strike on the third pulsed clock signal 42C. Thus, the third pulsed clock signal 42C does not include the clock pulse CP42C (the pulse is suppressed as shown in FIG. 5A). In some cases, it may be too short to allow the latches to properly capture the data rather than being suppressed completely. However, the correct resultant bit state is provided in the resultant output signal 62 due to the majority voting.

Figure 6:
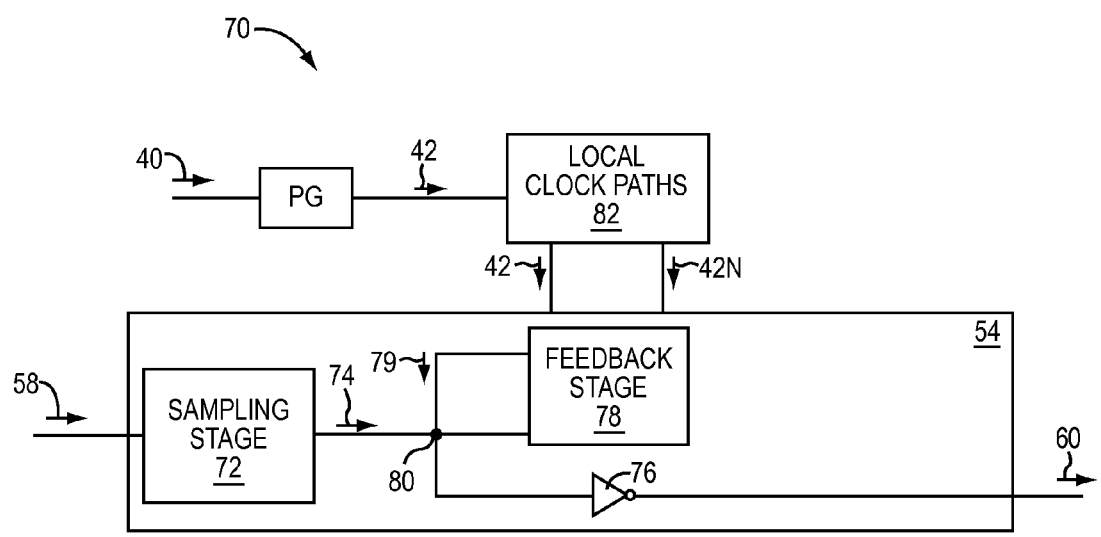
FIG. 6 is a block diagram of an exemplary pulsed clock latch.

FIG. 6 is a block diagram of exemplary pulsed clock latch 70. However, the pulsed clock latch 70 also includes a latch 54, which may be the first redundant latch 54A, the second redundant latch 54B, or the third redundant latch 54C. The latch 54 has a sampling stage 72 configured to sample the input bit signal 58 having an initial input bit state to generate the output bit signal 60 while the pulsed clock signal 42 is in the first clock state. The output bit signal 60 could be the output bit signal 60A, the output bit signal 60B, or the output bit signal 60C. Thus, the latch 54 is transparent while the pulsed clock signal 42 is in the first clock state. To generate the output bit signal 60, the sampling stage 72 generates an intermediary output bit local clock path 74. The output bit signal 60 may be one of the output bit signal 60A, the output bit signal 60B, and the output bit signal 60C. Since an intermediary output bit state of the intermediary output bit local clock paths 74 is based on the initial input bit state, the first input bit state of the input bit signal 58 is related to the intermediary output bit state of the intermediary output bit local clock paths 74. In this example, the intermediary output bit state and the output bit state are inverted by an inverter 76.

A feedback stage 78 is configured to drive the intermediary output bit state of the intermediary output bit local clock paths 74 such that the intermediary output bit state is held at storage node 80 as provided from the sampling stage 72 while the pulsed clock signal 42 is in the second clock state. The feedback stage 78 generates a feedback signal 79 having a bit state set in accordance with the intermediary output bit state of the intermediary output bit local clock paths 74. Thus, the latch 54 is opaque while the pulsed clock signal 42 is in the second clock state. The pulsed clock signal 42 may be one of the first pulsed clock signal 42A, the second pulsed clock signal 42B, and the third pulsed clock signal 42C.

The pulsed clock latch 70 has a pulsed clock generator PG, which may be the pulsed clock generator PGA, the pulsed clock generator PGB, or the pulsed clock generator PGC. The pulsed clock generator PG is configured to generate the pulsed clock signal 42 from a clock input signal 40. The clock input signal 40 may be the first clock input signal 40A, the second clock input signal 40B, and the third clock input signal 40C. In this embodiment, local clock paths 82 are coupled between the pulsed clock generator PG and the latch 54. One of the local clock paths 82 provides the pulsed clock signal 42 and another provided a pulsed clock signal 42N, which is inverted with respect to the pulsed clock signal 42.

Figure 7:
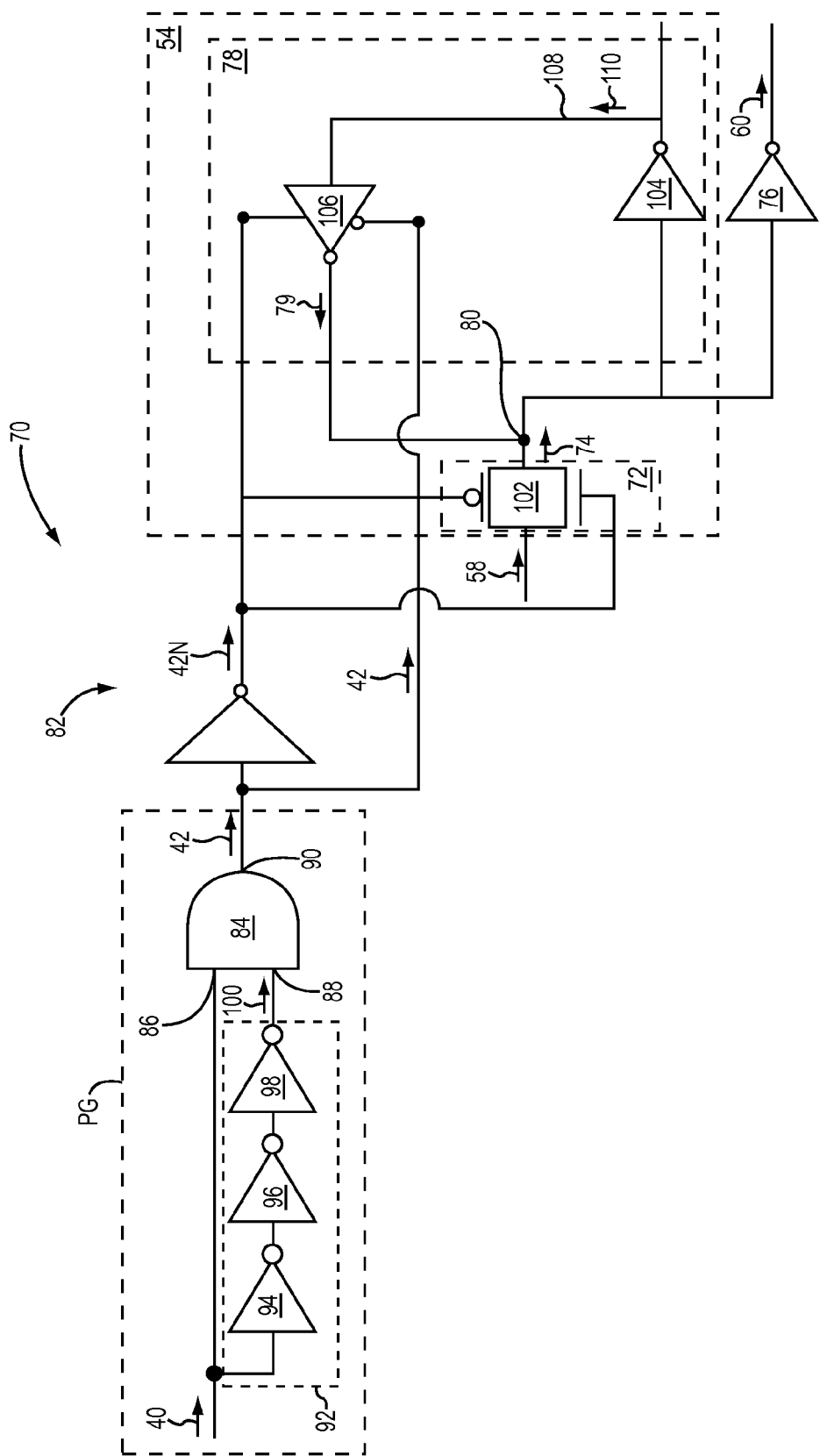
FIG. 7 illustrates an exemplary circuit diagram of the pulsed clock latch shown in FIG. 6.

FIG. 7 illustrates an exemplary circuit diagram of the pulsed clock latch 70 shown in FIG. 6. The pulsed clock generator PG is configured to generate the pulsed clock signal 42 from the clock input signal 40. The clock generation circuit includes an AND gate 84 having an AND gate input terminal 86, an AND gate input terminal 88, and an AND gate output terminal 90. The pulsed clock generator PG also includes a delay circuit 92, which in this embodiment includes an inverter 94, an inverter 96, and an inverter 98 coupled in series. The AND gate 84 is configured to receive the clock input signal 40 at the AND gate input terminal 86 while the delay circuit 92 is configured to receive the clock input signal 40 at the inverter 94.

The delay circuit 92 is configured to have a propagation delay Δd and is thus configured to generate a delayed clock signal 100. The delayed clock signal 100 is received by the AND gate 84 at the AND gate input terminal 88. Note that the inverter 94, the inverter 96, and the inverter 98 in the delay circuit 92 provide an odd number of inversions. Consequently, the delayed clock signal 100 is inverted and delayed with respect to the clock input signal 40 by the propagation delay Δd. The propagation delay Δd is significantly shorter than a time duration t of a clock period of the clock input signal 40. Thus, although the delayed clock signal 100 also has a clock period of the time duration t, the clock input signal 40 and the delayed clock signal 100 overlap in the first clock state (which in this embodiment is high) for the propagation delay Δd. Consequently, the AND gate 84 generates the pulsed clock signal 42 from the AND gate output terminal 90 in the first clock state during a clock period having a time duration equal to the propagation delay Δd. The local clock paths 82 may be coupled to the AND gate output terminal 90 so as to receive the pulsed clock signal 42.

In this example, the sampling stage 72 is provided by a pass gate 102, and the feedback stage 78 is provided by an inverter gate 104 and a tristate inverter gate 106 in a feedback path 108. The inverter gate 104 generates an intermediary feedback signal 110 having an intermediary feedback bit state set in accordance with the intermediary output bit state of the intermediary output bit local clock paths 74. The tristate inverter gate 106 generates the feedback signal 79 having the bit state set in accordance with the intermediary feedback bit state of the intermediary feedback signal 110. The tristate inverter gate 106 is configured to deactivate while the pulsed clock signal 42 is in the first clock state (which is high in this embodiment), and thus when the pass gate 102 is transparent. The tristate inverter gate 106 is configured to activate while the pulsed clock signal 42 is second clock state (which is low in this embodiment), and thus when the pass gate 102 is opaque.

When activated, the tristate inverter gate 106 drives the output bit state of the output bit signal 60 at the storage node 80 in accordance with the feedback bit state of the feedback signal 79. However, while the pulsed clock signal 42 is in the first clock state, the tristate inverter gate 106 is deactivated. The intermediary output bit state of the intermediary output bit local clock paths 74 was set in accordance with the input bit state of the input bit local clock paths 74 while the pulsed clock signal 42 was in the first clock state during the previous clock period.

Figure 8:
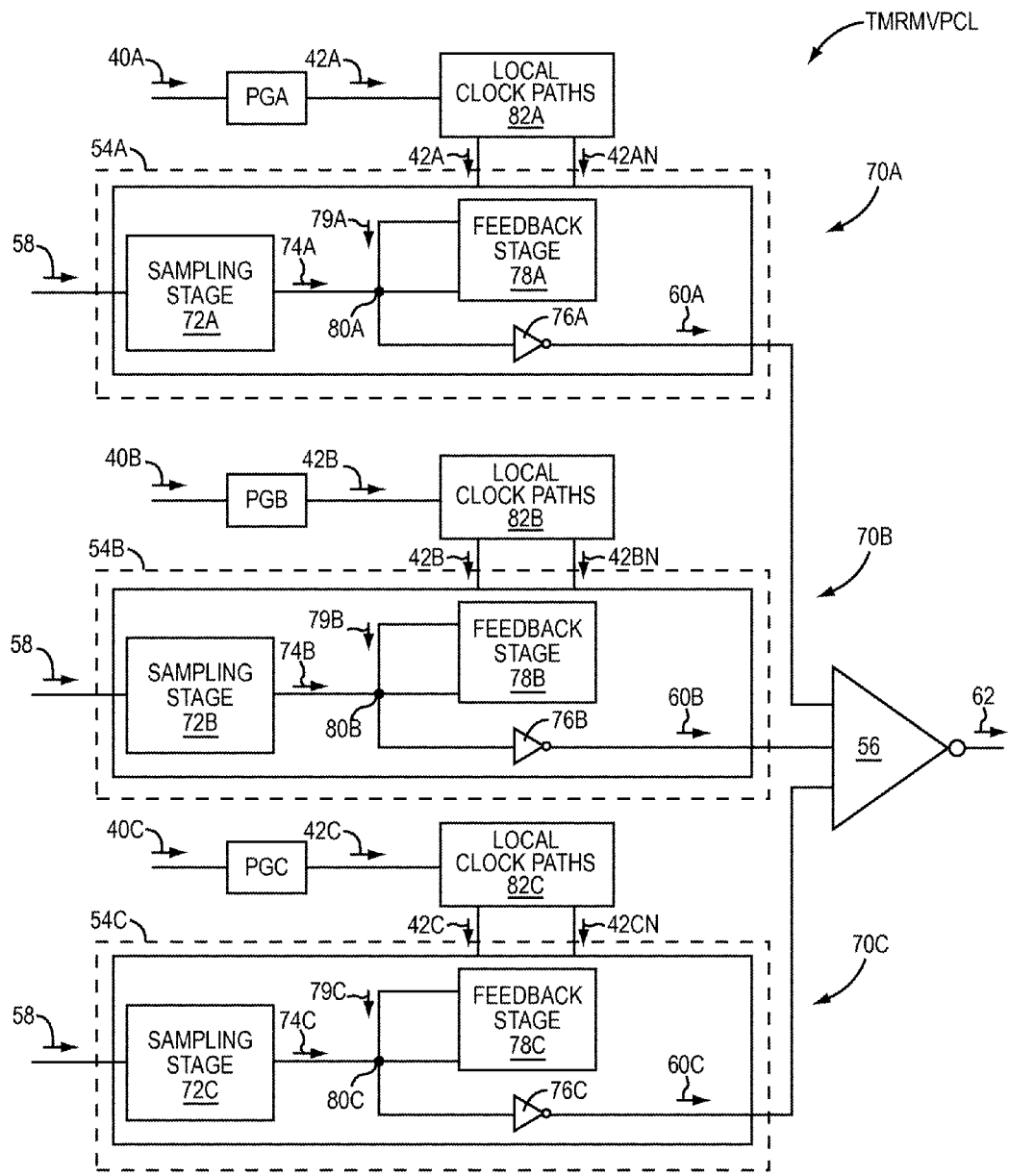
FIG. 8 illustrates one embodiment of a triple mode redundant majority voted pulsed clock latch.

FIG. 8 illustrates one embodiment of a triple mode redundant majority voted pulsed clock latch TMRMVPCL, which includes one embodiment of a pulsed clock latch 70A (which is identical to the pulsed clock latch 70 shown in FIG. 6), the pulsed clock latch 70B (which is identical to the pulsed clock latch 70 shown in FIG. 6) and the pulsed clock latch 70C (which is identical to the pulsed clock latch 70 shown in FIG. 6). In this embodiment, the pulsed clock latch 70A is the pulsed clock latch 70 shown in FIG. 7. Thus, the sampling stage 72 is referred to as a sampling stage 72A, the storage node 80 is referred to as the storage node 80A, the feedback stage 78 is referred to as the feedback stage 78A, and the inverter 76 is referred to as the inverter 76A. The sampling stage 72A is configured to receive the input bit signal 58. The local clock paths 82 are referred to as the local clock paths 82A, which receives the first pulsed clock signal 42A from the pulsed clock generator PGA. The pulsed clock generator PGA is configured to generate the first pulsed clock signal 42A based on the first clock input signal 40A, as explained above with respect to FIGS. 2 and 4.

The pulsed clock latch 70B is a pulsed clock latch that is identical to the pulsed clock latch 70 shown in FIG. 7. Thus, the sampling stage 72 is referred to as a sampling stage 72B, the storage node 80 is referred to as the storage node 80B, the feedback stage 78 is referred to as the feedback stage 78B, and the inverter 76 is referred to as the inverter 76B. The sampling stage 72B is configured to receive the input bit signal 58. The local clock paths 82 are referred to as the local clock paths 82B, which receives the second pulsed clock signal 42B from the pulsed clock generator PGB. The pulsed clock generator PGB is configured to generate the second pulsed clock signal 42B based on the second clock input signal 40B, as explained above with respect to FIGS. 2 and 4.

The pulsed clock latch 70C is a pulsed clock latch that is identical to the pulsed clock latch 70 shown in FIG. 7. Thus, the sampling stage 72 is referred to as a sampling stage 72C, the storage node 80 is referred to as the storage node 80C, the feedback stage 78 is referred to as the feedback stage 78C, the inverter 76 is referred to as the inverter 76C. The sampling stage 72C is configured to receive the input bit signal 58. The local clock paths 82 are referred to as the local clock paths 82C, which receives the third pulsed clock signal 42C from the pulsed clock generator PGC. The pulsed clock generator PGC is configured to generate the third pulsed clock signal 42C based on the third clock input signal 40C, as explained above with respect to FIGS. 2 and 4.

As explained above with respect to FIGS. 2 and 4, the majority gate is provided to receive the first output bit signal 60A from the first redundant latch 54A, the second output bit signal 60B from the second redundant latch 54B, and the third output bit signal 60C from the third redundant latch 54C. Due to the inverter gates 76A, 76B, 76C, the majority gate 56 is an inverting majority gate. The majority gate 56 is configured to set the resultant output bit state of the resultant output bit resultant output signal 62 to an inverse of the majority bit state of the first output bit state, the second output bit state, and the third output bit state.

Figure 9:
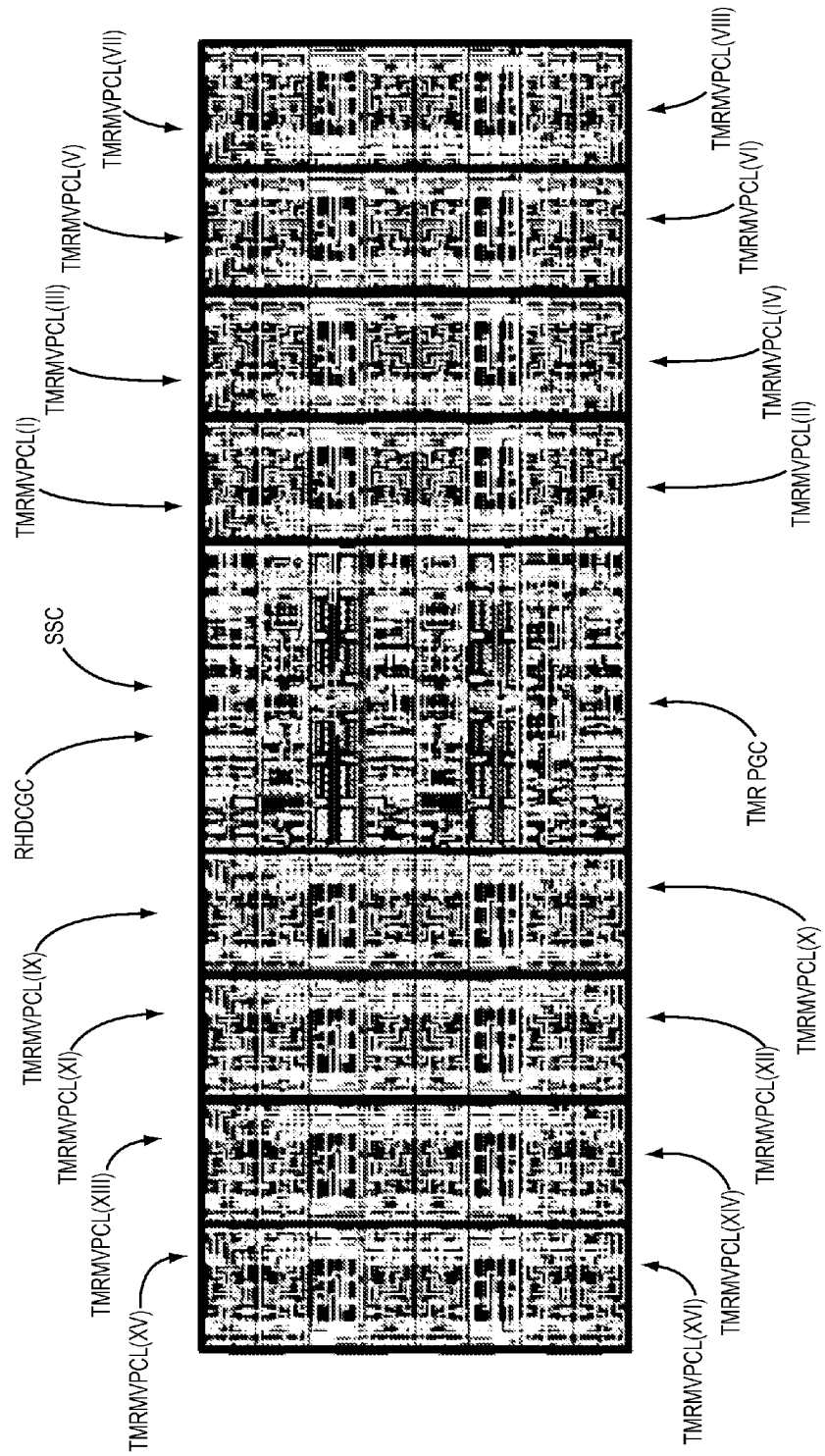
FIG. 9 illustrates a physical layout of one embodiment of a sixteen bit triple mode redundant majority voted pulsed clock latch (TMRMVPCL) shown in FIG. 1A, which is organized in cell columns.

It is important to configure the physical layout to make it statistically unlikely for a single impinging radiation particle to upset multiple nodes in the circuit, since upsetting for instance, two of the latches driving one majority gate would allow those upsets to propagate. FIG. 9 illustrates a physical layout of one embodiment of one of the SSCs shown in FIG. 1A, which is organized in interleaved cell columns. The SSC shown in FIG. 9 is a sixteen bit TMRMVPCL. Columns in the center provide the TMR PCG and the RHDCGC. One column of cell rows includes a TMRMVPCL(I) and a TMRMVPCL(II). Another column of cell rows includes a TMRMVPCL(III) and a TMRMVPCL(IV). Another column of cell rows includes a TMRMVPCL(V) and a TMRMVPCL(VI). Another column of cell rows includes a TMRMVPCL(VII) and a TMRMVPCL(VIII). Another column of cell rows includes a TMRMVPCL(IX) and a TMRMVPCL(X). Another column of cell rows includes a TMRMVPCL(XI) and a TMRMVPCL(XII). Another column of cell rows includes a TMRMVPCL(XIII) and a TMRMVPCL(XIV). Another column of cell rows includes a TMRMVPCL(XV) and a TMRMVPCL(XVI).

Figure 10:
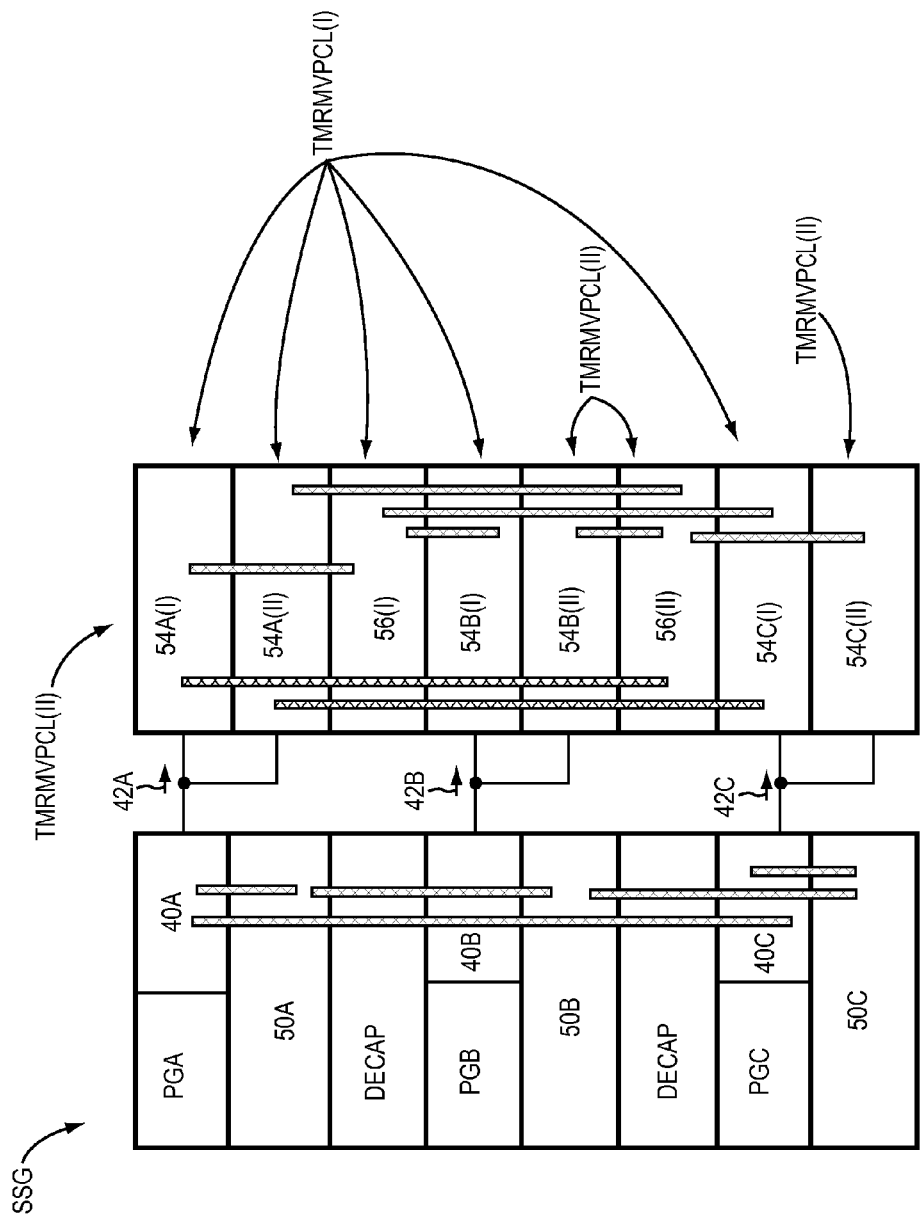
FIG. 10 illustrates the column organization of the sixteen bit TMRMVPCL of the SSC shown in FIG. 9.

FIG. 10 illustrates the column organization of the sixteen bit TMRMVPCL of the SSC shown in FIG. 9. In the center columns with the clocking circuitry, the delay elements 50A, 50B, 50C are provided along with the Muller C elements 48A, 48B, 48C and with the pulse clock generators PGA, PGB, PGC. In the other columns, the TMRMVPCL(I)

includes the first redundant latch 54A(I), the second redundant latch 54B(I), and the third redundant latch 54C(I), which are coupled to the majority gate 56(I). Also, in the other columns, the TMRMVPCL(II) includes the first redundant latch 54A(II), the second redundant latch 54B(II), and the third redundant latch 54C(II), which are coupled to the majority gate 56(II). The first redundant latch 54A(I) of the TMRMVPCL(I) and the first redundant latch 54A(II) of the TMRMVPCL(II) each receive the first pulsed clock signal 42A from the pulsed clock generator PGA. The second redundant latch 54B(I) of the TMRMVPCL(I) and the second redundant latch 54B(II) of the TMRMVPCL(II) each receive the second pulsed clock signal 42B from the pulsed clock generator PGB. The third redundant latch 54C(I) of the TMRMVPCL(I) and the third redundant latch 54C(II) of the TMRMVPCL(II) each receive the third pulsed clock signal 42C from the pulsed clock generator PGC.

Those skilled in the art will recognize improvements and modifications to the preferred embodiments of the present disclosure. All such improvements and modifications are considered within the scope of the concepts disclosed herein and the claims that follow.

What is claimed is:

1. A radiation hardened digital circuit, comprising:
   a delay network configured to receive a global clock signal and generate a first delayed clock signal from the global clock signal such that the first delayed clock signal is delayed with respect to the global clock signal; and
   a first Muller C element configured to receive the global clock signal and the first delayed clock signal, wherein the first Muller C element is configured to:
      generate a first clock input signal;
      set the first clock input signal to one of a set of clock states in response to the first delayed clock signal and the global clock signal each being provided in a same one of the set of clock states, wherein the set of clock states comprises a first clock state and a second clock state; and
      hold the first clock input signal in the one of the set of clock states in response to the first delayed clock signal and the global clock signal being provided in different ones of the set of clock states.

2. The radiation hardened digital circuit of claim 1, further comprising:
   a first pulsed clock generator configured to generate a first pulsed clock signal from the first clock input signal; and
   a first latch configured to receive the first pulsed clock signal and a first input bit signal having a first input bit state, the first latch is being configured to:
      generate a first output bit signal;
      sample the first input bit state to set a first output bit state of the first output bit signal based on the first input bit state in response to the first pulsed clock signal being in one of the set of clock states; and
      hold the first output bit state while the first pulsed clock signal is in an other one of the set of clock states.

3. The radiation hardened digital circuit of claim 1 further comprising a second Muller C element wherein:
   the delay network is further configured to generate a second delayed clock signal from the first delayed clock signal such that the second delayed clock signal is delayed with respect to the first delayed clock signal; and
   the second Muller C element is configured to receive the global clock signal and the second delayed clock signal, wherein the second Muller C element is configured to:
      generate a second clock input signal such that the second clock input signal is delayed with respect to the first clock input signal;
      set the second clock input signal to one of a set of clock states in response to the second delayed clock signal and the global clock signal each being provided in a same one of the set of clock states; and
      hold the second clock input signal in the one of the set of clock states in response to the second delayed clock signal and the global clock signal being provided in different ones of the set of clock states.

4. The radiation hardened digital circuit of claim 3, further comprising:
   a first pulsed clock generator configured to generate a first pulsed clock signal from the first clock input signal;
   a second pulsed clock generator configured to generate a second pulsed clock signal from the second clock input signal such that the second pulsed clock signal is delayed with respect to the first pulsed clock signal;
   a first latch configured to receive the first pulsed clock signal and a first input bit signal having a first input bit state, the first latch is being configured to:
      generate a first output bit signal;
      sample the first input bit state to set a first output bit state of the first output bit signal based on the first input bit state in response to the first pulsed clock signal being in one of the set of clock states; and
      hold the first output bit state while the first pulsed clock signal is in an other one of the set of clock states; and
   a second latch configured to receive the second pulsed clock signal and the first input bit signal, the second latch is being configured to:
      generate a second output bit signal;
      sample the first input bit state to set a second output bit state of the second output bit signal based on the first input bit state in response to the second pulsed clock signal being in one of the set of clock states; and
      hold the second output bit state while the second pulsed clock signal is in an other one of the set of clock states.

5. The radiation hardened digital circuit of claim 4 further comprising:
   a third pulsed clock generator configured to receive the global clock signal and generate a third pulsed clock signal from the global clock signal; and
   a third latch configured to receive the third pulsed clock signal and the first input bit signal, the third latch is being configured to:
      generate a third output bit signal;
      sample the first input bit state to set a third output bit state of the third output bit signal based on the first input bit state in response to the third pulsed clock signal being in one of the set of clock states; and
      hold the third output bit state while the third pulsed clock signal is in an other one of the set of clock states.

6. The radiation hardened digital circuit of claim 5 further comprising a majority gate configured to receive the first output bit signal, the second output bit signal, and the third output bit signal wherein the majority gate is configured to generate a first resultant output bit signal set to a majority bit state of the first output bit state, the second output bit state, and the third output bit state.

7. The radiation hardened digital circuit of claim 6 further comprising a first delay element configured to receive the global clock signal and generate the first delayed clock signal from the global clock signal.

8. The radiation hardened digital circuit of claim 7 further comprising a second delay element configured to receive the first delayed clock signal and generate the second delayed clock signal from the first delayed clock signal.

9. The radiation hardened digital circuit of claim 8 wherein the first delay element and the second delay element are identical.

10. The radiation hardened digital circuit of claim 4 further comprising a global clock tree wherein the first Muller C element and the second Muller C element are coupled to the first pulsed clock generator and the second pulsed clock generator through the global clock tree.

11. The radiation hardened digital circuit of claim 3 further comprising a third Muller C element wherein:
the delay network is further configured to generate a third delayed clock signal from the second delayed clock signal such that that the third delayed clock signal is delayed with respect to the third delayed clock signal; and
the third Muller C element is configured to receive the global clock signal and the third delayed clock signal, wherein the third Muller C element is configured to:
generate a third clock input signal such that the third clock input signal is delayed with respect to the second clock input signal;
set the third clock input signal to one of a set of clock states in response to the third delayed clock signal and the global clock signal each being provided in a same one of the set of clock states; and
hold the third clock input signal in the one of the set of clock states in response to the third delayed clock signal and the global clock signal being provided in different ones of the set of clock states.

12. The radiation hardened digital circuit of claim 11, further comprising:
a first pulsed clock generator configured to generate a first pulsed clock signal from the first clock input signal;
a second pulsed clock generator configured to generate a second pulsed clock signal from the second clock input signal such that the second pulsed clock signal is delayed with respect to the first pulsed clock signal;
a third pulsed clock generator configured to generate a third pulsed clock signal from the third clock input signal such that the third pulsed clock signal is delayed with respect to the second pulsed clock signal;
a first latch configured to receive the first pulsed clock signal and a first input bit signal having a first input bit state, the first latch is being configured to:
generate a first output bit signal;
sample the first input bit state to set a first output bit state of the first output bit signal based on the first input bit state in response to the first pulsed clock signal being in one of the set of clock states; and
hold the first output bit state while the first pulsed clock signal is in an other one of the set of clock states;
a second latch configured to receive the second pulsed clock signal and the first input bit signal, the second latch is being configured to:
generate a second output bit signal;
sample the first input bit state to set a second output bit state of the second output bit signal based on the first input bit state in response to the second pulsed clock signal being in one of the set of clock states; and
hold the second output bit state while the second pulsed clock signal is in an other one of the set of clock states; and
a third latch configured to receive the third pulsed clock signal and the first input bit signal, the third latch is being configured to:
generate a third output bit signal;
sample the first input bit state to set a third output bit state of the third output bit signal based on the first input bit state in response to the third pulsed clock signal being in one of the set of clock states; and
hold the third output bit state while the third pulsed clock signal is in an other one of the set of clock states.

13. The radiation hardened digital circuit of claim 12 further comprising a majority gate configured to receive the first output bit signal, the second output bit signal, and the third output bit signal wherein the majority gate is configured to generate a first resultant output bit signal set to a majority bit state of the first output bit state, the second output bit state, and the third output bit state.

14. The radiation hardened digital circuit of claim 13 further comprising a first delay element configured to receive the global clock signal and generate the first delayed clock signal from the global clock signal.

15. The radiation hardened digital circuit of claim 14 further comprising a second delay element configured to receive the first delayed clock signal and generate the second delayed clock signal from the first delayed clock signal.

16. The radiation hardened digital circuit of claim 15 further comprising a third delay element configured to receive the second delayed clock signal and generate the third delayed clock signal from the second delayed clock signal.

17. The radiation hardened digital circuit of claim 16 wherein the first delay element, the second delay element, and the third delay element are identical.

18. The radiation hardened digital circuit of claim 16 further comprising a global clock tree wherein the first delay element, the first Muller C element, the second Muller C element, the third Muller C element are each configured to receive the global clock signal through the global clock tree.

19. The radiation hardened digital circuit of claim 18 further comprising a global clock circuit coupled to the global clock tree and configured to generate the global clock circuit.

20. The radiation hardened digital circuit of claim 19 wherein the delay network, the first Muller C element, the second Muller C element, the third Muller C element, the first pulsed clock generator, the second pulsed clock generator, the third pulsed clock generator, the first latch, the second latch, the third latch, and the majority gate are each provided in a sequential state circuit.

* * * * *

UNITED STATES PATENT AND TRADEMARK OFFICE
CERTIFICATE OF CORRECTION

PATENT NO. : 9,467,144 B2
APPLICATION NO. : 14/808348
DATED : October 11, 2016
INVENTOR(S) : Lawrence T. Clark Page 1 of 1

It is certified that error appears in the above-identified patent and that said Letters Patent is hereby corrected as shown below:

In the Specification

In Column 1, Line 2, immediately after the title, add the following paragraph:
--This invention was made with government support under DE-NE0000679 awarded by the Department of Energy. The government has certain rights in the invention.--

Signed and Sealed this
Fifth Day of November, 2019

Andrei Iancu
*Director of the United States Patent and Trademark Office*